(12) United States Patent
Summerfelt et al.

(10) Patent No.: US 6,528,386 B1
(45) Date of Patent: Mar. 4, 2003

(54) PROTECTION OF TUNGSTEN ALIGNMENT MARK FOR FERAM PROCESSING

(75) Inventors: Scott R. Summerfelt, Garland, TX (US); Luigi Colombo, Dallas, TX (US); Stephen R. Gilbert, San Francisco, CA (US); Theodore S. Moise, IV, Dallas, TX (US); Sanjeev Aggarwal, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/097,919

(22) Filed: Mar. 13, 2002

Related U.S. Application Data
(60) Provisional application No. 60/342,583, filed on Dec. 20, 2001.

(51) Int. Cl.[7] ............................................. H01L 21/76
(52) U.S. Cl. ....................................... 438/401; 438/677
(58) Field of Search ................................. 438/401, 637, 438/648, 677, 692, 700, 975, 633, 643, 703

(56) References Cited

U.S. PATENT DOCUMENTS

| 5,872,042 A | * | 2/1999 | Hsu et al. |
| 6,157,087 A | | 12/2000 | Zhao et al. |
| 6,261,967 B1 | | 7/2001 | Athavale et al. |
| 6,284,654 B1 | | 9/2001 | Roeder et al. |
| 6,316,797 B1 | | 11/2001 | Van Buskirk et al. |
| 6,352,904 B2 | | 3/2002 | Tan et al. |

OTHER PUBLICATIONS

"FeRAM Tutorial", Ali Sheikholeslami and P. Glenn Gulak, A survey of circuit innovations in Ferroelectric random–access memories, Proceedings of the IEEE, vol. 88, No. 3, May, 2000, 3 pages, taken from the Internet at http://www.eecg.toronto.edu/–ali/ferro/tutorial/html.

"A survey of Cirucit Innovations in Ferroelectric Random Access Memories", Ali Sheikholeslami and P. Glenn Gulak, Processings of the IEEE, vol. 88, No. 5, May, 2000, pp. 667–689.

* cited by examiner

*Primary Examiner*—David Nelms
*Assistant Examiner*—Phuc T. Dang
(74) *Attorney, Agent, or Firm*—Jacqueline J. Garner; W. James Brady, III; Frederick J. Telecky, Jr.

(57) ABSTRACT

A method of fabricating a ferroelectric capacitor is disclosed. The method comprises the patterning of a top electrode layer and a dielectric layer to form a capacitor stack structure having sidewalls associated therewith. Prior to patterning the bottom electrode layer, a protective film is formed on the sidewalls of the capacitor stack structure in order to protect the dielectric material from conductive contaminants associated with a subsequent patterning of the bottom electrode layer.

23 Claims, 10 Drawing Sheets

PROTECTION OF TUNGSTEN ALIGNMENT MARK FOR FERAM PROCESSING

RELATED APPLICATION

This application claims priority to Serial No. 60/342,583 filed Dec. 20, 2001, which is entitled "Protection of tungsten Alignment Mark for FeRAM Processing".

CROSS-REFERENCE TO RELATED PATENT/PATENT APPLICATIONS

The following patents/patent applications are hereby incorporated herein by reference:

| Patent No./Ser. No. | Filing Date | TI Case No. |
| --- | --- | --- |
| 09/739,065 | Dec. 18, 2000 | TI-29966 |
| 09/741,650 | Dec. 19, 2000 | TI-29968 |
| 09/741,479 | Dec. 19, 2000 | TI-29969 |
| 09/741,675 | Dec. 19, 2000 | TI-29972 |
| 09/741,677 | Dec. 19, 2000 | TI-30077 |
| 09/741,688 | Dec. 19, 2000 | Ti-30137 |
| 09/392,988 | Sep. 09, 1999 | TI-26586 |
| 09/105,738 | Jun. 26, 1998 | TI-25297 |
| 09/238,211 | Jan. 27, 1999 | TI-26778 |

FIELD OF THE INVENTION

The instant invention pertains to semiconductor device fabrication and processing and more specifically to a method of fabricating a ferroelectric memory device.

BACKGROUND OF THE INVENTION

Several trends exist presently in the semiconductor device fabrication industry and the electronics industry. Devices are continuously getting smaller and requiring less power. A reason for these trends is that more personal devices are being fabricated which are relatively small and portable, thereby relying on a small battery as its primary supply source. For example, cellular phones, personal computing devices, and personal sound systems are devices which are in great demand in the consumer market. In addition to being smaller and more portable, personal devices are requiring more computational power and on-chip memory. In light of all these trends, there is a need in the industry to provide a computational device which has memory and logic functions integrated onto the same semiconductor chip. Preferably, this memory will be configured such that if the battery dies, the contents of the memory will be retained. Such a memory device which retains its contents while power is not continuously applied thereto is called a non-volatile memory. Examples of conventional non-volatile memory include: electrically erasable, programmable read only memory ("EEPROM") and FLASH EEPROM.

A ferroelectric memory (FeRAM) is a non-volatile memory which utilizes a ferroelectric material, such as strontium bismuth tantalate (SBT) or lead zirconate titanate (PZT), as a capacitor dielectric situated between a bottom electrode and a top electrode. Both read and write operations are performed for an FeRAM. The memory size and memory architecture affects the read and write access times of an FeRAM. Table 1 illustrates exemplary differences between different memory types.

TABLE 1

| Property | SRAM | Flash | DRAM | FeRAM (Demo) |
| --- | --- | --- | --- | --- |
| Voltage | >0.5 V | Read >0.5 V Write (12 V) (±6 V) | >1 V | 3.3 V |
| Special Transistors | NO | YES (High Voltage) | YES (Low Leakage) | NO |
| Write Time | <10 ns | 100 ms | <30 ns | 60 ns |
| Write Endurance | >$10^{15}$ | <$10^{5}$ | >$10^{15}$ | >$10^{13}$ |
| Read Time (single/multi bit) | <10 ns | <30 ns | <30 ns/<2 ns | 60 ns |
| Read Endurance | >$10^{15}$ | >$10^{15}$ | >$10^{15}$ | >$10^{13}$ |
| Added Mask for embedded | 0 | ~6–8 | ~6–8 | ~3 |
| Cell Size (F~metal pitch/2) | ~80 $F^2$ | ~8 $F^2$ | ~8 $F^2$ | ~18 $F^2$ |
| Architecture | NDRO | NDRO | DRO | DRO |
| Non volatile | NO | YES | NO | YES |
| Storage | I | Q | Q | P |

The non-volatility of an FeRAM is due to the bistable characteristic of the ferroelectric memory cell. An FeRAM cell may be selected by two concurrent X and Y voltage pulses, respectively, wherein X and Y correspond to a specific bit line and word line, respectively, identified by horizontal and vertical decoder circuitry. The FeRAM cells of the capacitor array which receive only one voltage pulse remain unselected while the cell that receives both an X and Y voltage signal flips to its opposite polarization state or remains unchanged, depending upon its initial polarization state, for example.

Two types of ferroelectric memory cells are used commonly, a single capacitor memory cell and a dual capacitor memory cell. The single capacitor memory cell (referred to as a 1T/1C or 1C memory cell) requires less silicon area (thereby increasing the potential density of the memory array), but is less immune to noise and process variations. Additionally, a 1C cell requires a voltage reference for determining a stored memory state. The dual capacitor memory cell (referred to as a 2T/2C or 2C memory cell) requires more silicon area, and it stores complementary signals allowing differential sampling of the stored information. The 2C memory cell is more stable than a 1C memory cell.

As illustrated in prior art FIG. 1, a 1T/1C FeRAM cell 10 includes one transistor 12 and one ferroelectric storage capacitor 14. A bottom electrode of the storage capacitor 14 is connected to a drain terminal 15 of the transistor 12. The 1T/1C cell 10 is read from by applying a signal to the gate 16 of the transistor (word line WL)(e.g., the Y signal), thereby connecting the bottom electrode of the capacitor 14 to the source of the transistor (the bit line BL) 18. A pulse signal is then applied to the top electrode contact (the plate line or drive line DL) 20. The potential on the bitline 18 of the transistor 12 is, therefore, the capacitor charge divided by the bitline capacitance. Since the capacitor charge is dependent upon the bistable polarization state of the ferroelectric material, the bitline potential can have two distinct values. A sense amplifier (not shown) is connected to the bitline 18 and detects the voltage associated with a logic value of either 1 or 0. Frequently the sense amplifier reference voltage is a ferroelectric or non-ferroelectric capacitor connected to another bitline that is not being read. In this manner, the memory cell data is retrieved.

A characteristic of a ferroelectric memory is that a read operation is destructive in some applications. The data in a memory cell is then rewritten back to the memory cell after the read operation is completed. If the polarization of the ferroelectric is switched, the read operation is destructive and the sense amplifier must rewrite (onto that cell) the correct polarization value as the bit just read from the cell. This is similar to the operation of a DRAM. If the drive line voltage was small enough not to switch the ferroelectric then the read operation was not destructive. In general, a non-destructive read requires a much larger capacitor than a destructive read and, therefore, requires a larger cell size.

As illustrated, for example, in prior art FIG. 2, a 2T/2C memory cell 30 in a memory array couples to a bit line ("bitline") 32 and an inverse of the bit line ("bitline-bar") 34 that is common to many other memory types (for example, static random access memories). Memory cells of a memory block are formed in memory rows and memory columns. The dual capacitor ferroelectric memory cell comprises two transistors 36 and 38 and two ferroelectric capacitors 40 and 42, respectively. The first transistor 36 couples between the bitline 32 and a first capacitor 40, and the second transistor 38 couples between the bitline-bar 34 and the second capacitor 42. The first and second capacitors 40 and 42 have a common terminal or plate (the drive line DL) 44 to which a signal is applied for polarizing the capacitors.

In a write operation, the first and second transistors 36 and 38 of the dual capacitor ferroelectric memory cell 30 are enabled (e.g., via their respective word line 46) to couple the capacitors 40 and 42 to the complementary logic levels on the bitline 32 and the bitline-bar line 34 corresponding to a logic state to be stored in memory. The common terminal 44 of the capacitors is pulsed during a write operation to polarize the dual capacitor memory cell 30 to one of the two logic states.

In a read operation, the first and second transistors 36 and 38 of the dual capacitor memory cell 30 are enabled via the word line 46 to couple the information stored on the first and second capacitors 40 and 42 to the bar 32 and the bitline-bar line 34, respectively. A differential signal (not shown) is thus generated across the bitline 32 and the bar-bar line 34 by the dual capacitor memory cell 30. The differential signal is sensed by a sense amplifier (not shown) which provides a signal corresponding to the logic level stored in memory.

A memory cell of a ferroelectric memory is limited to a finite number of read and write operations before the memory cell becomes unreliable. The number of operations that can be performed on a FeRAM memory is known as the endurance of a memory. The endurance is an important factor in many applications that require a nonvolatile memory. Other factors such as memory size, memory speed, and power dissipation also play a role in determining if a ferroelectric memory is viable in the memory market.

A first step in the formation of the FeRAM cell is the formation of a capacitor stack. Typically, such a stack is formed by consecutively forming layers such as the bottom diffusion barrier layer, the bottom electrode layer, the dielectric layer and the top electrode layer, as illustrated in prior art FIG. 3. Subsequently, a hard mask layer is formed thereover and defined in accordance with a desired dimension of the capacitor structure. The defined hard mask is then employed in a subsequent, multi-step etch process by which the various layers are patterned so as to be relatively self-aligned with respect to the hard mask. Therefore the capacitor stack structure is defined in accordance with a single lithography step by which the hard mask is defined. Accordingly, an alignment associated with such lithography step is important in minimizing FeRAM cell size. That is, since the capacitor structure typically makes contact to an underlying transistor structure via a tungsten (W) contact, an accurate alignment of the capacitor with respect thereto permits the FeRAM cell size to be minimized.

The alignment of the capacitor structure is dictated primarily by the lithography step employed to define the hard mask layer, and such alignment is achieved using an alignment mark.

SUMMARY OF THE INVENTION

The following presents a simplified summary in order to provide a basic understanding of some aspects of the invention. This summary is not an extensive overview of the invention. It is intended to neither identify key or critical elements of the invention nor to delineate the scope of the invention. Rather, the primary purpose of this summary is to present some concepts of the invention in a simplified form as a prelude to the more detailed description that is presented later.

The present invention relates generally to the fabrication of an FeRAM device that is either a stand-alone device or one which is integrated onto a semiconductor chip that includes many other device types. Several requirements either presently exist or may become requirements for the integration of FeRAM with other device types. One such requirement involves utilizing, as much as possible, the conventional front end and backend processing techniques used for fabricating the various logic and analog devices on the chip to fabricate this chip which will include FeRAM devices. In other words, it is beneficial to utilize as much of the process flow for fabricating these standard logic devices (in addition to I/O devices and potentially analog devices) as possible, so as not to greatly disturb the process flow (thus increase the process cost and complexity) merely to integrate the FeRAM devices onto the chip.

The following discussion is based on the concept of creating the ferroelectric capacitors in an FeRAM process module that occurs between the front end module (defined to end with the formation of tungsten, which has the chemical symbol W, contacts) and backend process module (mostly metallization). Other locations of the FeRAM process module have also been proposed. For example, if the FeRAM process module is placed over the first layer of metallization (Metal-1) then a capacitor over bitline structure can be created with the advantage that a larger capacitor can be created.

Another possible location for the FeRAM process module is near the end of the back-end process flow. One advantage of this approach is that it keeps new contaminants in the FeRAM module (Pb, Bi, Zr, Ir, Ru, or Pt) out of more production tools. This solution is most practical if the equipment used after deposition of the first FeRAM film is dedicated to the fabrication of the FeRAM device structures and, therefore, is not shared. However, this solution may have the drawback of requiring FeRAM process temperatures compatible with standard metallization structures (suggested limitations discussed above). In addition, the interconnection of the FeRAM capacitor to underlying transistors and other needs of metallization may not be compatible with a minimum FeRAM cell size.

The requirements for the other locations will have many of the same concerns but some requirements may be different.

The FeRAM process module is preferably compatible with standard logic and analog device front-end process flows that include, for example, the use of tungsten contacts as the bottom contact of the capacitor. The FeRAM thermal budget is preferably low enough so that it does not impact substantially the front end structures such as the low resistance structures (which includes the tungsten plugs and silicided source/drains and gates) employed in many logic devices. In addition, transistors and other front end devices, such as diodes, may be sensitive to contamination. Contamination from the FeRAM process module, either direct (such as by diffusion in the chip) or indirect (cross contamination through shared equipment), should be addressed so as to avoid transistor and diode degradation. The FeRAM devices and process module should also be compatible with standard backend process flow. Therefore the FeRAM process module should have minimum degradation of logic metallization's resistance and parasitic capacitance between metal and transistor. In addition, the FeRAM devices should not be degraded by the backend process flow with minimal, if any modification. This is a significant challenge since ferroelectric capacitors have been shown to be sensitive to hydrogen degradation and most logic backend process flows utilize hydrogen and/or deuterium in many of the processes (such as in the formation of $SiO_2$ and $Si_3N_4$, CVD tungsten deposition, $SiO_2$ via etch, and forming gas anneals).

Commercial success of FeRAM also advantageously addresses minimization of embedded memory cost. Total memory cost is primarily dependent on cell size, periphery ratio size, impact of yield, and additional process costs associated with memory. In order to have cost advantage per bit compared to standard embedded memories such as embedded DRAM and Flash it is desirable to have FeRAM cell sizes that are similar to those obtained with standard embedded memory technology. Some of the methods discussed in this patent to minimize cell size include making the process flow less sensitive to lithography misalignment, forming the capacitor directly over the contact, and using a single mask for the capacitor stack etch. Some of the methods discussed in this patent, to reduce the added process cost, may require two additional masks for the FeRAM process module and a planar capacitor which reduces the complexity of the needed processes.

Although this patent focuses on using a planar capacitor, a three dimensional capacitor using post or cup structure can be fabricated using many of the same concepts and processes. The planar structure is illustrated because it uses a simpler process and is cheaper to make. The 3D capacitor is preferred when the planar capacitor area needed for minimum charge storage considerations limits the cell size. In this situation, the capacitor area enhancement associated with the 3D configuration allows a smaller planar cell size. DRAM devices have used this approach for many years in order to reduce cell area.

The present invention relates to a method of forming an FeRAM capacitor. In particular, the present invention relates to a method of establishing a reliable alignment mark in conjunction with the formation of an FeRAM capacitor. In general, an alignment mark is employed in a lithography step to properly align a mask used to define the capacitor stack using, for example, a hard mask layer. With proper and accurate alignment, the capacitor stack width (and thus its size) can be minimized without concern of losing electrical contact to an underlying transistor structure, for example, via a conductive contact. Therefore by ensuring an accurate alignment of the capacitor stack, an FeRAM capacitor size can be minimized, thereby facilitating an increase in memory density when such FeRAM capacitors are employed in an FeRAM array.

The present invention establishes a reliable alignment mark by effectively smoothing a sidewall surface roughness of a tungsten layer within an alignment mark via. With the tungsten sidewall surface roughness reduced, a step coverage of a subsequent barrier layer over the tungsten sidewall within the alignment mark via is improved substantially. Accordingly, the barrier layer is substantially more effective in preventing the tungsten layer within the alignment mark via to oxidize (which tungsten will do aggressively), thus preventing a substantial volume expansion which may otherwise accompany such oxidation. Therefore the barrier layer permits subsequent layers such as the capacitor stack layers to form in a substantially conformal manner in the alignment mark via which causes a top portion of the capacitor stack layers to exhibit a topography difference associated therewith. Such a topography difference is then employed as the alignment mark for the lithography step used to pattern the capacitor stack layers to thereby form the capacitor stack.

According to one aspect of the present invention, a method of forming an FeRAM capacitor over one or more transistors associated with a semiconductor substrate is disclosed. The method comprises forming a dielectric layer over the one or more transistors and forming a contact via and an alignment mark via, respectively, in the dielectric layer. A tungsten layer is the formed over the substrate, covering the dielectric layer, filling the contact via, and covering the alignment mark via in a substantially conformal manner, wherein the tungsten layer has a sidewall surface within the alignment mark via. The method further comprises reducing a roughness associated with the sidewall surface of the tungsten within the alignment mark via. Accordingly, the step coverage of a subsequently formed barrier layer over the smoothed tungsten within the alignment mark via is improved substantially due to the reduced tungsten sidewall surface roughness.

The method further comprises patterning the tungsten layer to thereby remove portions overlying the dielectric layer and thus electrically isolate the contact via from the alignment mark via. Capacitor stack layers are then formed over the substrate and overlying the alignment mark via in a substantially conformal manner. In the above manner, the alignment mark via is reflected in a top portion of the capacitor stack layers as a topology variation. Such a topology variation or difference is then employed as an alignment mark in the subsequent lithography step used to pattern the capacitor stack layers to define the capacitor stack. The improved step coverage of the barrier layer within the alignment mark via prevents an oxidation of the underlying tungsten layer during subsequent processing steps, for example, during the deposition of the capacitor stack layers. By preventing the oxidation of the tungsten, the shape integrity of the alignment mark via is maintained, thus permitting a topology difference in the top of the capacitor stack layers to accurately reflect the position of the alignment mark via. In the above manner, the alignment mark and its position is reliably established.

In accordance with another aspect of the present invention, the sidewall surface roughness of the tungsten layer in the alignment mark via is reduced by forming a smoothing layer over the tungsten layer prior to the formation of a barrier layer thereover. The smoothing layer is then patterned so as to remove a portion thereof which overlies the dielectric layer and the contact via, leaving another portion of the smoothing layer on the sidewall surface of the tungsten layer within the alignment mark via. In accordance with one example, the smoothing layer is patterned via a chemical mechanical polish process, while in another example, such patterning occurs via a chemical etch process.

The remaining portion of the smoothing layer on the sidewall surface of the tungsten layer in the alignment mark via results in a smooth sidewall surface, thus substantially improving a step coverage of the subsequently formed barrier layer thereover. The improved barrier layer step coverage prevents any potential tungsten oxidation during subsequent processing steps.

According to another aspect of the present invention, a reduction of the tungsten sidewall surface roughness within the alignment mark via comprises removing a portion of the tungsten layer therein. In one example, substantially all of the tungsten layer within the alignment mark via is removed using an extra mask step in which a region over the alignment mark via is defined and the tungsten therein is removed substantially via etching. In another example, an exposed surface portion of the tungsten layer has a surface roughness associated therewith reduced via a preliminary etch process. For example, in adding Ar to the etch process, portions of etched tungsten redeposit on the tungsten sidewall surface within the alignment mark via. Subsequently, a chemical mechanical polish is employed to remove remaining portions of tungsten which overlie the dielectric layer and the contact via, respectively, thereby leaving the smoothed tungsten sidewall layer within the alignment mark via. The smooth tungsten sidewall surface facilitates improved step coverage for a subsequently formed barrier layer, thereby preventing oxidation of the tungsten within the alignment mark via.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

Similar reference numerals are used throughout the figures to designate like or equivalent features. The figures are not drawn to scale. They are merely provided to illustrate various features associated with the present invention.

DETAILED DESCRIPTION OF THE DRAWINGS

Figure 1:
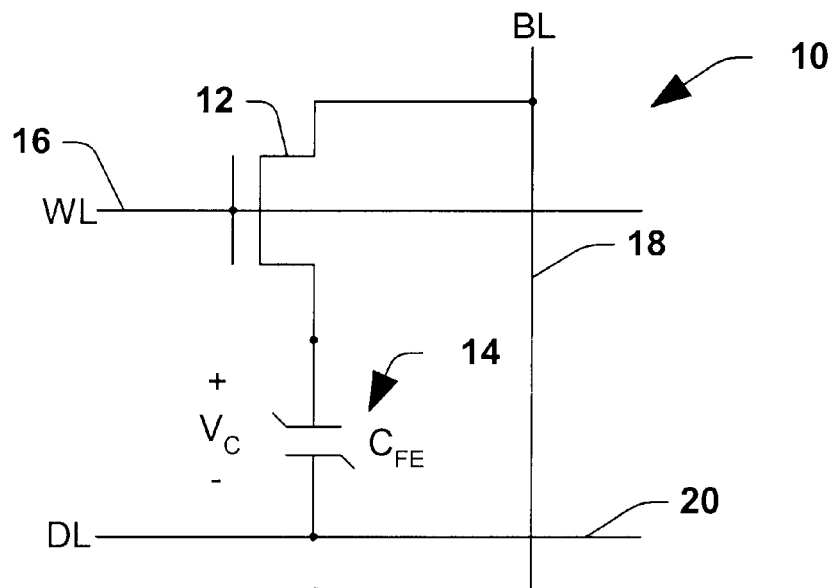
FIG. 1 is a prior art schematic diagram illustrating an exemplary 1T/1C FeRAM memory cell.

While the following description of the instant invention revolves around the integration of the FeRAM devices with logic devices and other devices which can be found on a digital signal processor, microprocessor, smart card, microcomputer, microcontroller or system on a chip, the instant invention can be used to fabricate stand-alone FeRAM devices or FeRAM devices integrated into a semiconductor chip which has many other device types. In particular, the improved performance of the FeRAM device of the instant invention compared to standard semiconductor memories appears to make FeRAM the memory of choice for any handheld device which requires low power and large degree of device integration. The figures provided herewith and the accompanying description of the figures are merely provided for illustrative purposes. One of ordinary skill in the art should realize, based on the instant description, other implementations and methods for fabricating the devices and structures illustrated in the figures and in the following description. For example, while shallow trench isolation structures ("STI") are illustrated, any conventional isolation structures may be used, such as field oxidation regions (also known as LOCOS regions) or implanted regions. In addition, while structure 102 is preferably a single-crystal silicon substrate which is doped to be n-type or p-type, structure 102 (FIG. 1) may be formed by fabricating an epitaxial silicon layer on a single-crystal silicon substrate.

The present invention is directed generally to a method of forming an alignment mark for use in fabricating an FeRAM capacitor. The present invention fabricates the alignment mark in a reliable manner and thus enables the capacitor stack size to be minimized by ensuring an accurate alignment of the stack with regard to an underlying component or structure, for example, a conductive via. The alignment mark fabrication methodology of the present invention comprises reducing a sidewall surface roughness of a tungsten film within an alignment mark via so that a step coverage associated with an overlying barrier layer is improved substantially, thereby preventing the underlying tungsten material within the alignment mark via from oxidizing during subsequent processing steps.

By preventing oxidation of the tungsten within the alignment mark via, volume expansion associated with such oxidation is also eliminated, thereby allowing subsequently formed layers (such as the capacitor stack layers) to form within the alignment mark via in a substantially conformal manner. Such conformal behavior causes the alignment mark via to be reflected accurately in a top portion of overlying layers as a topographical variation which serves as an alignment mark in the subsequent patterning of the capacitor stack layers. By accurately generating the alignment mark thereby in a reliable manner, one can minimize the FeRAM capacitor stack (and thus the cell size) without sacrificing the reliability of the connection of the FeRAM capacitor to underlying components through, for example, contact vias.

In order to best understand the present invention, a brief description of an FeRAM cell will be described and a discussion of the problems associated with conventional alignment marks will be provided. Once the disadvantages of conventional methods are understood, the advantages of the present invention will be fully appreciated.

Figure 3:
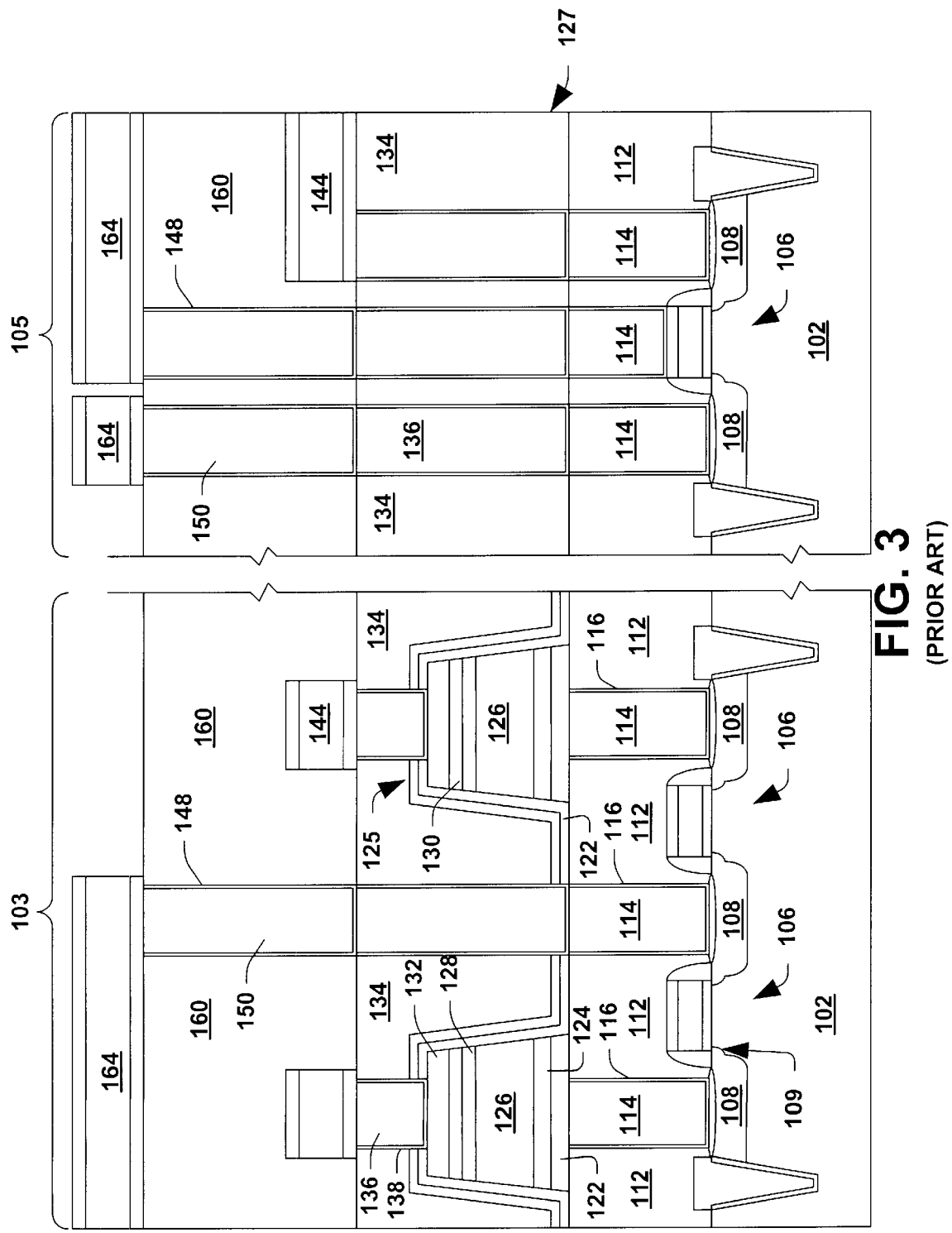
FIG. 3 is a fragmentary cross-sectional view of a partially fabricated device containing an FeRAM capacitor fabricated in accordance with one exemplary aspect of the present invention.

Referring initially to FIG. 3, an exemplary, fragmentary cross section of a semiconductor device 100 is provided in which two devices are illustrated. A first device 103 represents a partially fabricated version of am FeRAM cell in accordance with the present invention, and a second device 105 represents any high-voltage transistor, low-voltage transistor, high-speed logic transistor, I/O transistor, analog transistor, or any other device which may be included in a digital signal processor, microprocessor, microcomputer, microcontroller or any other semiconductor device. Except for the specific cell structure provided in the device 103, the structures utilized therein may be the same as the device structures of the device 105 (except for some possible variations in the transistors due to the different device types that device 105 may be).

Basically, gate structures 106 include a gate dielectric (for example, comprising silicon dioxide, an oxynitride, a silicon nitride, BST, PZT, a silicate, any other high-k material, or any combination or stack thereof), a gate electrode (for example, comprising polycrystalline silicon doped either p-type or n-type with a silicide formed on top, or a metal such as titanium, tungsten, TiN, tantalum, TaN or other type metal). The gate structures 106 further comprise side wall insulators (for example, comprising an oxide, a nitride, an oxynitride, or a combination or stack thereof). In general, the generic terms oxide, nitride and oxynitride refer to silicon oxide, silicon nitride and silicon oxy-nitride. The term "oxide" may, in general, include doped oxides as well, such as boron and/or phosphorous doped silicon oxide. Source/drain regions 108 may be formed via, for example, implantation using conventional dopants and processing conditions. Lightly doped drain extensions 109 as well as pocket implants may also be utilized. In addition, the source/drain regions 108 may be silicided (for example, with titanium, cobalt, nickel, tungsten or other conventional silicide material).

A dielectric layer 112 is formed over the entire substrate 102 and is patterned and etched so as to form openings for contacts to the substrate and gate structures 106 to be formed (see, e.g., step 202 of FIG. 4). These openings are filled subsequently with one or more conductive materials, such as a plug 114 (for example, comprising a metal such as tungsten, molybdenum, titanium, titanium nitride, tantalum nitride, or a metal silicide such as Ti, Ni or Co, copper or doped polysilicon). A liner/barrier layer 116 may or may not be formed between the plug 114 and dielectric 112. Such a liner/barrier layer 116 is illustrated in FIG. 3 and comprises, for example, Ti, TiN, TaSiN, Ta, TaN, TiSiN, a stack thereof, or any other conventional liner/barrier material. Preferably, the contacts are formed so as to land on the silicided regions of the source/drain regions and gate structures.

The dielectric layer 112 comprises, for example, $SiO_2$ (doped or undoped with preferable dopants such as boron or phosphorous) possibly with a layer of hydrogen or deuterium containing silicon nitride next to the gate. After deposition of the diffusion barrier 116 it is likely that the barrier will be planarized for improved lithography of overlying layers using a process such as chemical mechanical polishing (CMP). In addition, an added diffusion barrier/etch stop (not shown) may be included near the top surface of layer 112 such as $AlO_X$, AlN, $Si_3N_4$, $TiO_2$, $ZrO_2$, or $TaO_X$ that would be deposited after the planarization process. This diffusion barrier is particularly useful if damascene processes are used to create the via or metallization to the contact. The formation of the plug 114 will require etching through this optional barrier/etch stop.

Formation of metal structures which are situated above the contacts is considered to be part of the back end processes. Other than the specific FeRAM process module, the back end process steps may be those standard in the semiconductor industry. The metallization may be, for example, either Al or Cu based. The Al is preferably etched while the Cu is preferably used in a damascene approach. However, etching Cu and Al formed in a damascene process is also possible. According to one example, aluminum metallization will preferably have CVD tungsten plugs or Al plugs, and the Al will preferably be Cu-doped for improved electromigration resistance. Metal diffusion barriers for Al may include, for example, TiN and/or Ti. Copper metallization may have, for example, Cu or W plugs with either Ti, TiN, TiSiN, Ta, tantalum nitride, and/or TaSiN diffusion barriers.

A thin dielectric layer (not shown) may be formed between each of the interlevel dielectric (ILD) layers (layers 112, 134 and 160). If formed, this thin dielectric comprises, for example, silicon nitride, silicon carbide, SiCNO or a silicon oxide (for example, a high-density plasma oxide). In addition, interlevel dielectric layers 112, 134, and 160 may comprise, for example, an oxide, FSG, PSG, BPSG, PETEOS, HDP oxide, a silicon nitride, silicon oxynitride, silicon carbide, silicon carbo-oxy-nitride, a low dielectric constant material (for example, SiLK, porous SiLK, teflon, low-K polymer (possibly porous), aerogel, xerogel, BLACK DIAMOND, HSQ, or any other porous glass material), or a combination or stack thereof. The interconnects and the metal lines preferably comprise the same material. Plugs 136 and 150 and conductors 144 and 164 comprise a metal material (for example, copper, aluminum, titanium, TiN, tungsten, tungsten nitride, or any combination or stack thereof). A barrier/liner may be formed between the plug and the respective interlevel dielectric layer. If formed, the barrier/liner layer (shown as layers 138 and 148 and liners 142, 146, 162 and 166) comprises, for example, Ti, TiN, W, tungsten nitride, Ta, tantalum nitride, any conventional barrier/liner layer, or any combination or stack thereof). The interlayer dielectric and plug material should be compatible with the FeRAM thermal budget. With existing technology (i.e., one that incorporates a W plug and $SiO_2$ ILD), the FeRAM thermal budget should be less than approximately 600 or 650 C., however, the present invention is not limited thereto. If the ILD is modified to include a low dielectric constant ("low K") layer, the FeRAM thermal budget may need to be reduced further. The preferred interlayer dielectric 112 is therefore a material that can withstand a thermal budget in excess of 600 C., such as silicon oxide (doped and/or undoped), silicon nitride, and/or silicon oxy-nitride.

Level 127 is added so as to accommodate the FeRAM cells (FeRAM process module). This FeRAM process module allows the creation of ferroelectric or high dielectric constant capacitors to be easily added with maximum thermal budget for the new process module yet not impact the thermal budget of backend process. In particular, this level allows FeRAM devices with capacitor under bitline configuration compatible with a high-density memory. However, it is possible, if planarity is not a necessity, to form the FeRAM devices while not forming layer 127 in region 105. Hence, the FeRAM portion 103 would be taller than the region 105 by the height of layer 127.

Figure 2:
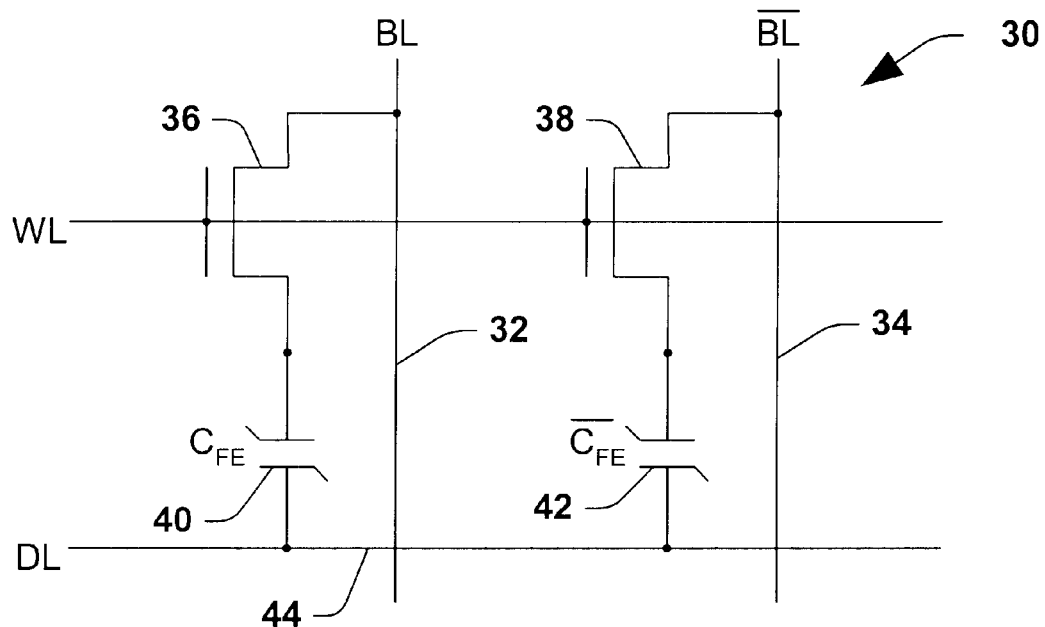
FIG. 2 is a prior schematic diagram illustrating an exemplary 2T/2C FeRAM memory cell.

Note that in FIG. 3, the FeRAM capacitor structure 125 overlies a conductive contact 114, which allows the capacitor structure to contact a portion of an underlying transistor structure within the semiconductor substrate 102. One exemplary connection is illustrated in the schematic diagrams of FIGS. 1 and 2, respectively. Note further that if the capacitor stack 125 is not aligned properly with the underlying contact 114, a contact resistance associated with the connection is undesirably increased, and in some extreme cases of misalignment, an electrical discontinuity can result. One manner in which an alignment of the FeRAM capacitor to an underlying conductive contact is achieved is through use of an alignment mark during the definition of the capacitor stack.

Typically, when the capacitor stack 125 is being defined, a hard mask layer 132 is deposited over the barrier layer 122, the bottom electrode layer 124, the ferroelectric dielectric layer 126, and the top electrode layer 128,130, respectively. The hard mask layer 132 is then patterned and used as a hard mask in subsequently patterning the underlying layers, and in that manner defines the alignment of the FeRAM capacitor stack with respect to an underlying contact 114. Accordingly, defining the hard mask properly is important in achieving proper electrical contact of the capacitor 125 to an underlying transistor structure in the substrate.

A conventional way in which the hard mask was defined was through a lithographic mask which was positioned or aligned with respect to an alignment mark. For reasons that will be described in greater detail below, the reliability of conventional alignment marks is poor, and consequently, the width of the hard mask conventionally is increased to ensure that the resulting capacitor 125 would contact the underlying via 114 despite modest amounts of misalignment. Such an increase in the hard mask width results in a corresponding increase in the width of the capacitor stack 125, thus negatively impacting a size of the FeRAM capacitor cell by increasing the cell size.

Figure 4A:
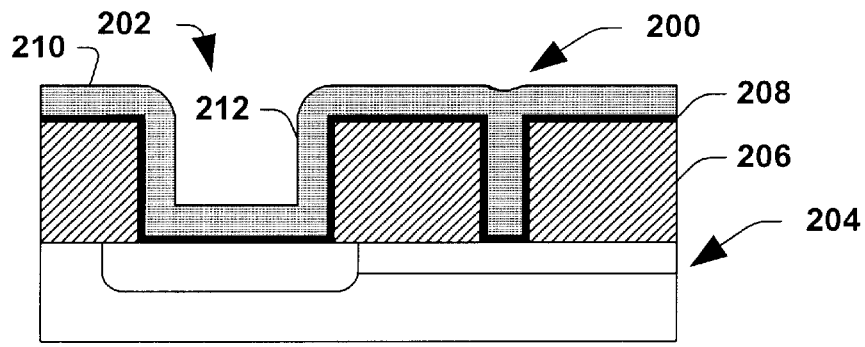
FIGS. 4a–4d are fragmentary cross section diagrams illustrating an alignment mark via and the formation of a substantially conformal tungsten layer and the capacitor stack layers therein in an ideal case.

Turning now to FIG. 4a, a fragmentary cross section of a standard contact via 200 and an alignment mark via 202 is illustrated. Note that the two vias 200 and 202 are illustrated next to one another for simplicity of explanation, however, it should be understood that the alignment mark via 202 may be located at any location on the semiconductor wafer, for example, in a scribe line. In FIG. 4a, an underlying material such as a processed semiconductor substrate 204 is covered by a dielectric material 206 such as SiO$_2$. Vias are then patterned in the dielectric 206 at desired locations such as the standard connection via 200 and the alignment mark via 202.

Note that the aspect ratio of the alignment mark via 202 is substantially larger than a standard via 200 for purposes that will be apparent below. A barrier layer 208 is then typically formed over the dielectric material 206 and in the vias 200 and 202, and then a contact material 210 such as tungsten is formed thereover. Note that as illustrated in FIG. 4a, the tungsten 210 fills the standard contact via 200, while the tungsten material covers the alignment mark via 202 in a generally conformal manner, having sidewalls 212 associated therewith.

Figure 4B:
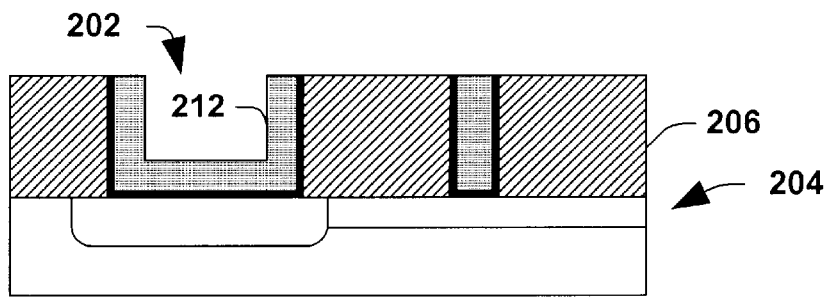
Figure 4C:
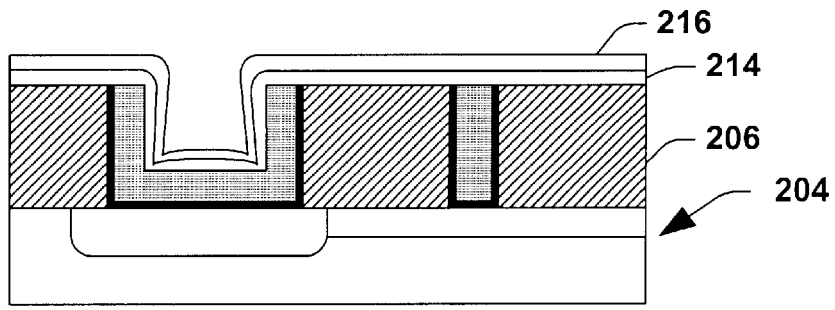
Figure 4D:
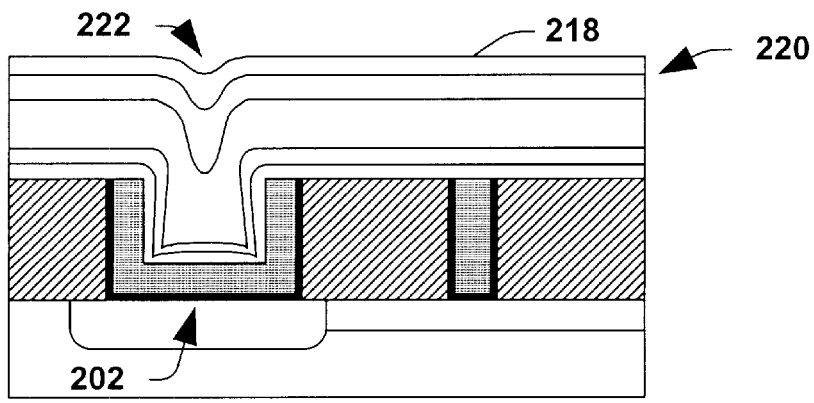

After the tungsten layer 210 is formed, a planarization step is performed, for example, as illustrated in FIG. 4b, wherein portions of the tungsten material and barrier layer overlying the dielectric layer 206 and the contact via 200 are removed. Subsequently, another barrier layer 214 and a bottom electrode layer 216 are formed thereover, as illustrated in FIG. 4c to initiate the formation of the capacitor stack. Subsequent layers (e.g., the capacitor stack layers and the hard mask layer) may further be deposited thereover in a manner similar to that illustrated in FIG. 4d, wherein a top portion 218 of the resulting stack 220 has a topography variation 222 associated therewith which reflects the location of the underlying alignment mark via 202. The topography variation 222 may be detected optically and is used as an alignment mark for a subsequent lithography step employed to pattern the hard mask, as discussed above.

Note that the conditions discussed above in conjunction with FIGS. 4a–4d represent an ideal case which does not exist typically under conventional fabrication conditions. In particular, the tungsten layer 210 of FIG. 4a is illustrated as having a smooth surface associated therewith; that is, a surface roughness associated therewith is illustrated as being substantially small. In typical, conventional conditions, however, such surface smoothness does not exist, but rather a substantial surface roughness exists as illustrated, for example, in FIG. 5a. The substantial surface roughness negatively impacts the step coverage of an overlying barrier layer.

In addition, the bottom electrode diffusion barrier and bottom electrode are typically deposited using physical vapor deposition. This deposition process typically has poor step coverage since the material primarily deposits by line of site from the sputter target. Therefore the thickness on the sides of the alignment mark even if perfectly smooth will be substantially thinner than on the top. With a rough surface on the sides of the alignment mark, the minimum barrier thickness will be reduced even more.

The thickness of the bottom electrode and bottom electrode diffusion barrier are thick enough so that contacts which have minimum 3D topography (W keyhole and small recess of W in the contact) are protected from oxidation during the deposition of the ferroelectric film.

Figure 5A:
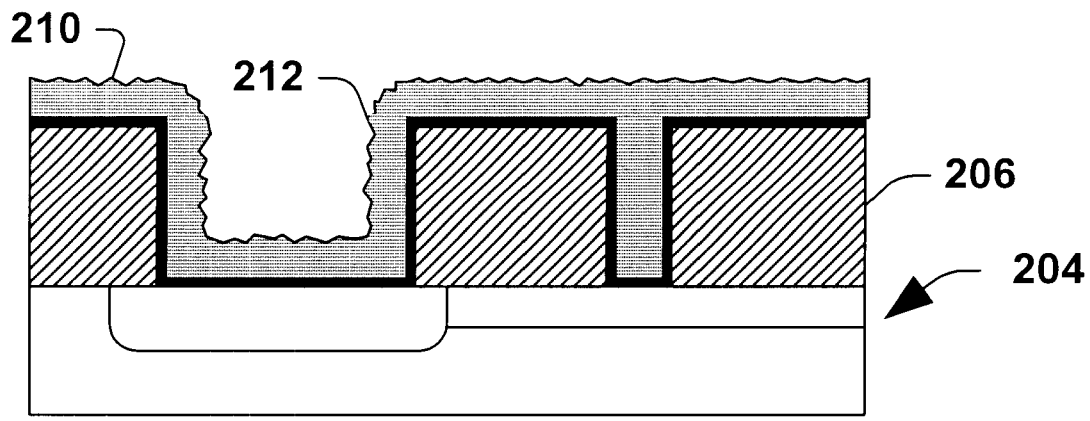
FIGS. 5a–5b are fragmentary cross section diagrams illustrating an alignment mark via and the formation of a substantially conformal tungsten layer therein with a surface roughness associated therewith via typical, non-ideal deposition conditions.
Figure 5B:
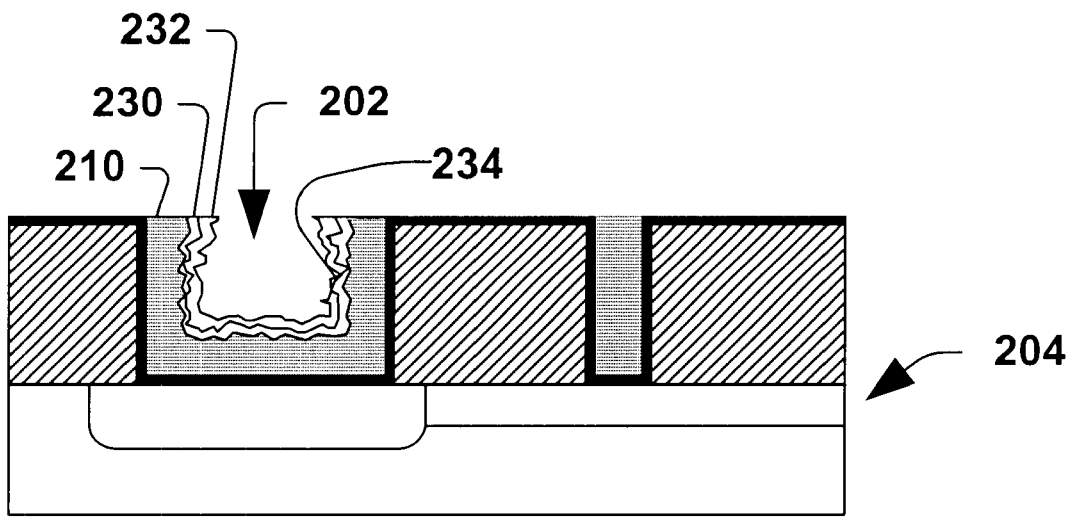

FIG. 5b is a fragmentary cross section diagram illustrating an exemplary barrier layer 230 and a bottom electrode layer 232 overlying the rough tungsten layer 210 within the alignment mark via 202 of FIG. 5a after a planarization step. Note that because of the surface roughness of the tungsten within the alignment mark via 202, the step coverage of the barrier layer is poor, sometimes resulting in a region 234 where the tungsten layer 210 within the alignment mark via 202 is exposed to subsequent processing conditions. Such processing conditions often include an oxygen rich environment, which causes the exposed tungsten to oxidize rapidly, and such oxidation often causes substantial volume expansion which results in hillocks (not shown) to form in an uncontrollable manner within the via 202. Such oxide hillocks may cause the subsequently formed capacitor stack layers to not be conformal with respect to the alignment mark via 202. Consequently, the top portion of the capacitor stack layers will not exhibit a topographical variation which accurately identifies an appropriate alignment position as desired. Alternatively, the hillocks may create a multi-surfaced or multi-faceted region which is difficult to identify with optical alignment instruments employed in stepper equipment. Further, even if a topography variation is identified, the position thereof may not identify accurately the position of the underlying alignment mark via 202.

The present invention overcomes the limitations associated with the prior art by reducing a sidewall surface roughness of the tungsten layer within the alignment mark via prior to the formation of a barrier layer thereover. Accordingly, the subsequent step coverage of such a barrier layer (over the tungsten layer within the alignment mark via) is improved substantially, thereby substantially preventing oxidation of the tungsten layer within the alignment mark via and the disadvantages associated with such oxidation. A method of forming an FeRAM capacitor having a reduced surface roughness within the alignment mark via in accordance with one exemplary aspect of the present invention is provided in the method of FIG. 6 and designated at reference numeral 300.

Figure 6:
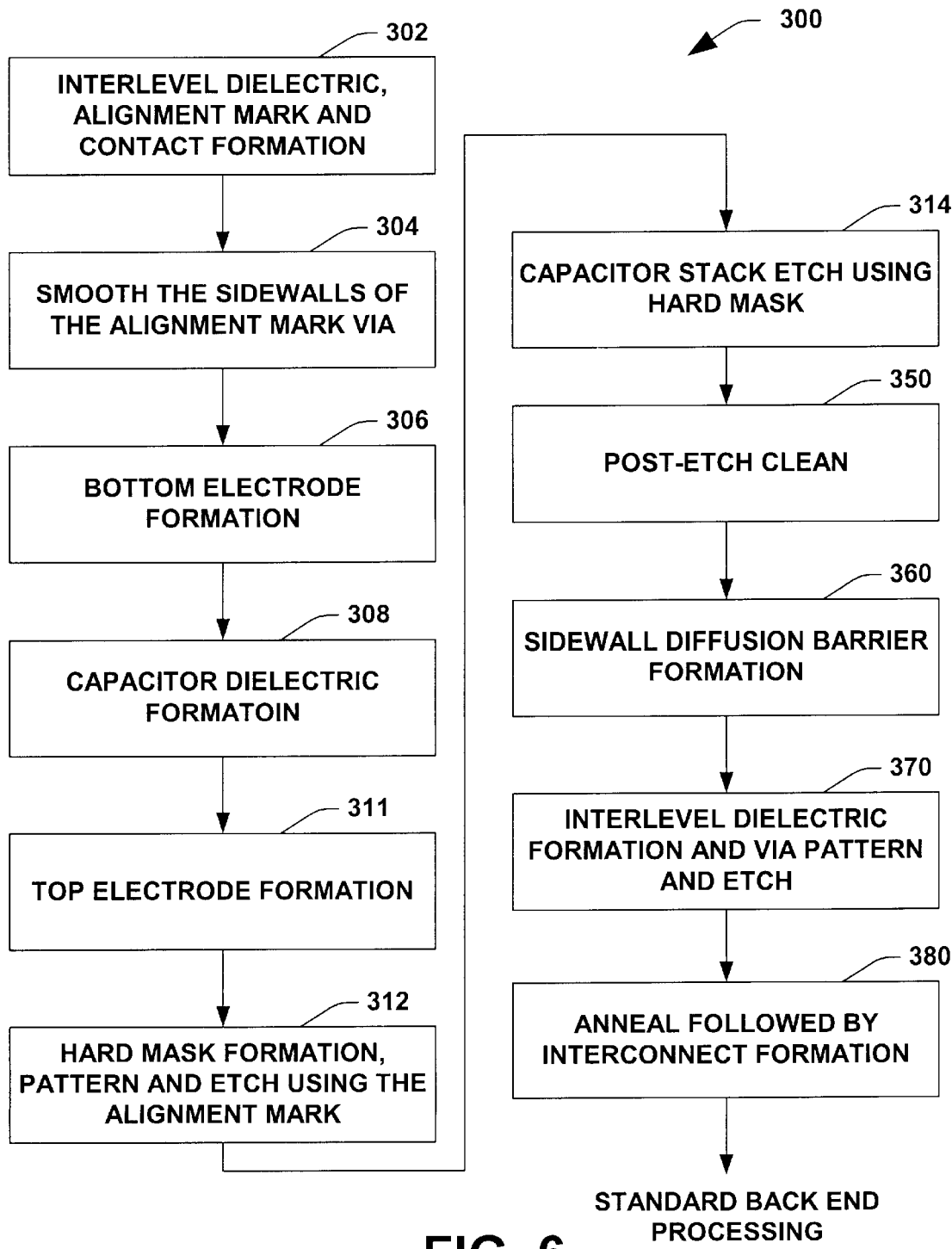
FIG. 6 is a flow chart diagram illustrating a method of forming an FeRAM capacitor in accordance with another exemplary aspect of the present invention.

Initially, a further discussion of FIG. 6 will be provided along with a number of fragmentary cross section diagrams to illustrate an exemplary process for fabricating such an FeRAM cell in order to provide a context in which the present invention may reside. In conjunction therewith, the present invention will be described and illustrated in greater detail. It should be understood, however, that although the present invention will be shown and described in conjunction with one exemplary context, the invention is applicable to other fabrication methodologies, structures and materials, and such alternatives are contemplated as falling within the scope of the present invention.

An exemplary method of forming an FeRAM capacitor in accordance with the present invention which is similar in many respects to the capacitor 125 of FIG. 3 will now be discussed in conjunction with FIGS. 6–10, respectively. Initially, at 302, after one or more transistor or other type structures have been formed in the semiconductor substrate, an interlevel dielectric is formed (for example, similar to the dielectric 112 of FIG. 3). One or more contact vias 200 (e.g., similar to those shown filled at 114 of FIG. 3) are then formed in the dielectric 206 to permit electrical contact down to structures associated with the substrate. In addition, at the time the contact vias 200 are formed, an alignment mark via 202 is also formed in the dielectric layer 206, as illustrated in FIG. 8. Note that similar to FIGS. 4a–4d, the alignment mark via 202 may be substantially larger than a standard contact via 200 to allow subsequent layers to be relatively conformal therein so as to provide a topographical variation in overlying layers for use as an alignment mark.

In addition, at 302, the alignment mark via 202 and the contact via(s) 200 are covered or otherwise filled with a conductive material such as tungsten. A barrier layer may also be deposited within the alignment mark via 202 and the contact via 200, respectively, prior to the deposition of tungsten to prevent a reaction of the tungsten with the dielectric material 206. Note that similar to FIG. 5a, the surface roughness of the tungsten layer is substantial. The W surface is typically highly faceted and as an estimate, the roughness is roughly one half of the W grain size. For discussion purposes, the local minimum to maximum thickness variation is between 20–50 nm. In addition, at the corners (bottom and sides) the W can deposit in such a manner that nooks can be formed. These nooks are nearly impossible for the barriers to be filled and therefore in order to be protected the nooks need to be covered. Consequently, the tungsten layer 210 has a roughness associated with the sidewall surface 212 within the alignment mark via 202. The sidewall surface roughness associated therewith is then reduced or protected at 304 of FIG. 6.

CVD Bottom Electrode or CVD Bottom Electrode Diffusion Barrier

In accordance with one exemplary aspect of the present invention, the tungsten sidewall surface within the alignment mark via may be protected (action 304) using a CVD deposited bottom electrode or a CVD deposited bottom electrode diffusion barrier. The problem with protecting the alignment marks is the three dimensional nature of the marks, because on the relatively flat top surface of the mark the electrode and electrode barriers are sufficient. The problem with alignment marks and other similar 3D structures is solved by changing one or both of the bottom electrode and bottom electrode diffusion barrier deposition processes to one with good step coverage such as CVD. In one embodiment, the bottom electrode barrier is deposited using CVD. If the ferroelectric deposition process is relatively low temperature, then TiN which has a relatively high oxidation rate can be used as the barrier. TiN has a well established CVD process which requires less development. If the ferroelectric deposition process is a higher temperature process, then a more stable bottom electrode barrier such as TiAlN, TaSiN, ZrN, HfN, CrN or other oxidation resistant barriers needs to be deposited using CVD.

The CVD process results in conformal coverage, resulting in sufficient thickness of the barrier layer even on the rough sides and nooks present in the alignment mark structures. In one preferred embodiment, the bottom electrode diffusion barrier is CVD TiAlN preferably between 20–70 nm thick and more preferably ~40 nm thick. The CVD TiAlN actually has significant amounts of H, C and O present as part of the CVD deposition process typically using metalorganic precursors. The CVD TiAlN process uses hardware and precursors similar to CVD TiN, for example. In this preferred embodiment, the CVD TiN is deposited using one solution of Ti and Al precursors flowing into one vaporizer. The deposition conditions are also similar to that of CVD TiN. The Al content is adjusted based on the thermal budget, but is peferentially between 10–50% Al/(Ti+Al) and more preferably between 30–40% Al.

Use of Additional CVD Conductive Barrier

In accordance with one exemplary aspect of the present invention, the tungsten sidewall surface within the alignment mark via may be protected (action 304 of FIG. 6) using an additional CVD bottom electrode diffusion barrier such as TiN (layer 308 of FIG. 8) underneath a bottom electrode diffusion barrier/etch stop. The advantage of a conductive barrier is that it does not have to be removed above the contacts using an additional process. The barrier enhances the protection both by smoothing the sides of the alignment mark and filling in nooks, and also by adding another diffusion barrier layer. In the case of TiN, its fast oxidation means that as a pure diffusion barrier it will be effective primarily at lower temperatures and also thicker layers.

In one preferred embodiment, CVD TiN (for example, about 10–40 nm) thick is deposited underneath the bottom electrode barrier. Depending on the bottom electrode diffusion barrier material such as TiAlN, this additional layer imposes no new processes other than increasing the effective thickness of the bottom electrode diffusion barrier.

Smoothing Sides of Alignment Mark Using CVD Dielectrics

In accordance with another exemplary aspect of the present invention, the tungsten sidewall surface within the alignment mark via may be protected (action 304 of FIG. 6) using an additional CVD dielectric layer. Subsequently, at 310 of FIG. 7, a smoothing layer 312 is formed over the barrier layer 308 in a generally conformal manner so as to cover the sidewall surface within the alignment mark via, as illustrated in FIG. 8. The goal of the smoothing layer 312 is to make it possible for the PVD deposited layers to protect the alignment mark. In one exemplary aspect of the present invention, the smoothing layer 312 comprises SiN and/or $SiO_2$, however, other materials, such as spin on glass may be employed which may have a smoother surface than the tungsten layer 210. One possible issue with using SiN and $SiO_2$ is that these materials react fairly rapidly with PbO which is a commonly used ferroelectric material. The reaction is not as severe as the oxidation of W, but it needs to be minimized either using the bottom electrode and bottom electrode diffusion barrier or through low thermal budget of the ferroelectric deposition itself.

In one exemplary embodiment, a conductive etch stop layer such as TiN (PVD or CVD) or even the bottom electrode diffusion barrier may be deposited prior to the dielectric smoothing layer. The etch stop can be used since the smoothing layer needs to be removed from the top layer using either a dry etch or CMP. The disadvantage of using the bottom electrode diffusion barrier as the etch stop layer is that the only barrier protecting the dielectric from reacting during the ferroelectric deposition is the bottom electrode.

Figure 7:
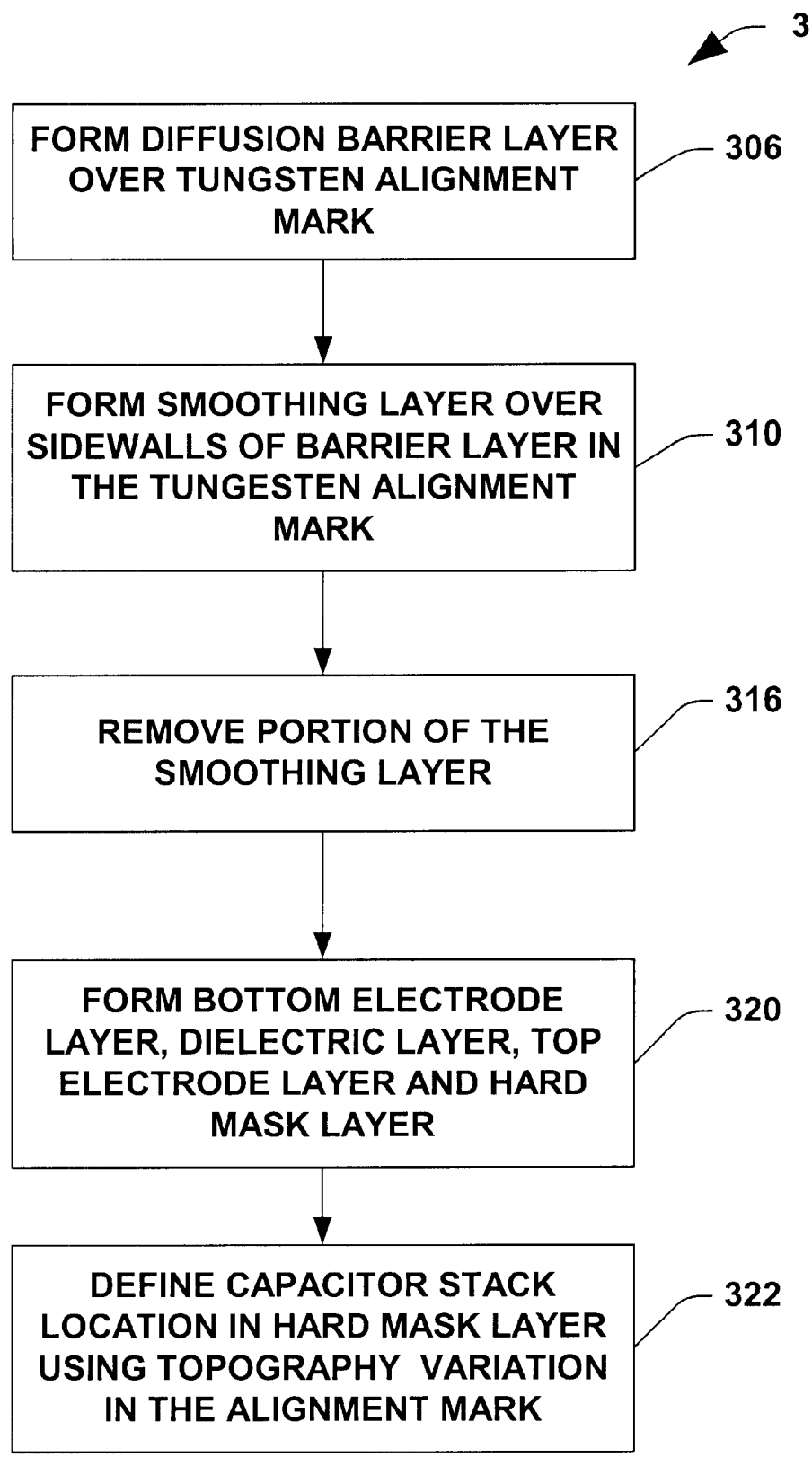
FIG. 7 is a flow chart diagram illustrating a method of forming an alignment mark in a reliable manner in accordance with another exemplary aspect of the present invention.
Figure 8:
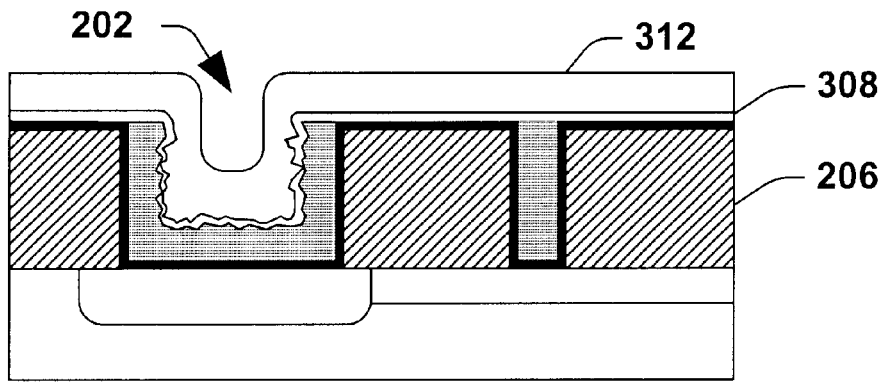
FIGS. 8–10 are fragmentary cross section diagrams illustrating various steps of forming an alignment mark for an FeRAM cell in accordance with yet another exemplary aspect of the present invention.
Figure 9:
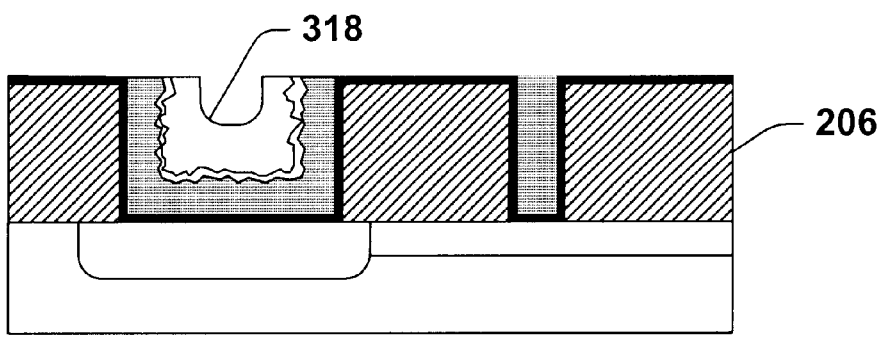
Figure 10:
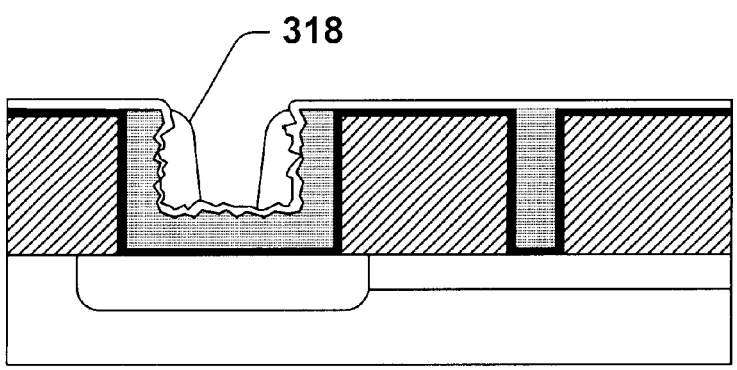

In accordance with another exemplary aspect of the present invention, the tungsten sidewall surface within the alignment mark via may be protected (action 304) in accordance with the flow chart of FIG. 7. A portion of the smoothing layer 310 is then removed at 316 of FIG. 7. In accordance with one exemplary aspect of the invention, portions of the smoothing layer 310 and the barrier layer 308 are removed via a planarization process, for example, a chemical mechanical polish (CMP), as illustrated in FIG. 9. Alternatively, the smoothing layer 310 is removed via a chemical etch process, as illustrated in FIG. 10. In such an example, the selection of the smoothing layer material 310, the barrier layer material 308 and the etch chemistry is selected to provide a substantially high selectivity so that an overetch of the smoothing layer may be performed to ensure a substantially complete removal of the smoothing layer material on the top surface of the dielectric 206 and in a bottom portion of the alignment mark via 202. In such a manner, the underlying barrier layer 308 serves as an etch stop for the smoothing layer etch within the alignment mark via 202.

In either process of removal of the smoothing layer 310 at 316, a portion 318 of the smoothing layer 312 remains within the alignment mark via 202, for example, as illustrated in FIGS. 9 and 10, wherein the sidewalls of the alignment mark via have a surface roughness that has been substantially reduced.

Returning to FIG. 7, the method 304 continues at 320, wherein a plurality of layers are formed associated with the capacitor stack. For example, such a stack may include a bottom electrode layer, a ferroelectric dielectric layer, a top electrode layer and a hard mask layer, respectively. Due to the size of the alignment mark via, each of the above layers will be relatively conformal with respect to the alignment mark via, thus producing a topography variation in the hard mask layer (the top portion of the capacitor stack layers) which reflects accurately a location of the alignment mark via 202 thereunder. Accordingly, the topography variation is employed as an alignment mark for a lithography mask employed to define the patterning of the hard mask layer at 322 which, as discussed above, dictates a location of the capacitor stack.

Therefore as can be seen by the method 300 of FIGS. 6 and 7, the sidewall surface roughness of the tungsten layer 210 within the alignment mark via 202 may be reduced in order to improve the step coverage of a subsequently formed barrier layer to thus maintain the shape integrity of the alignment mark via so that subsequently formed layers may be substantially conformal with respect to the alignment mark via. Note that in FIGS. 8–10, a barrier layer 308 was formed prior to the formation of the smoothing layer 310. Such a barrier layer 308, however, may be optional if the smoothing layer is not reactive with respect to the tungsten therein.

Figure 11:
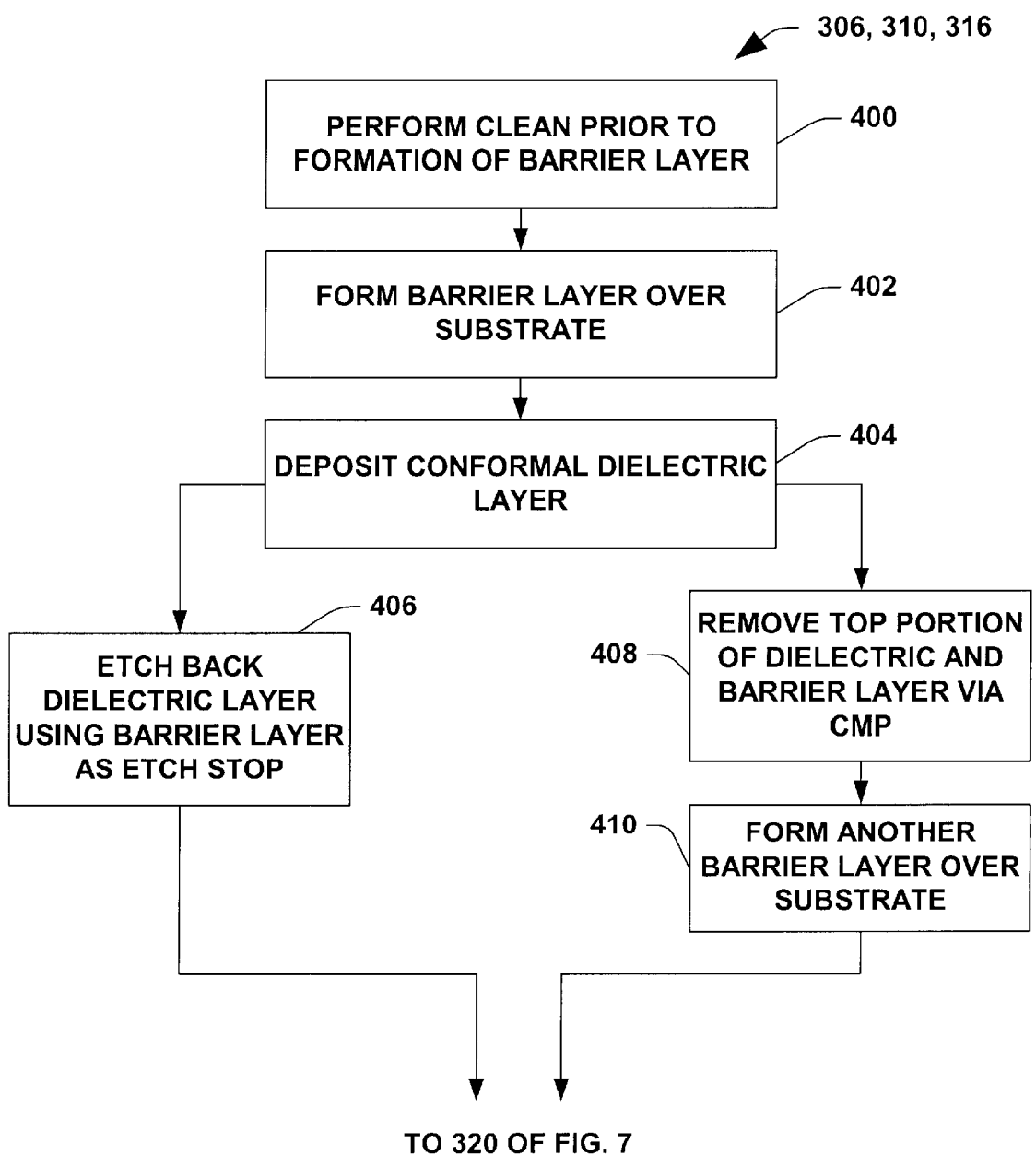
FIG. 11 is another flow chart diagram illustrating methods of forming an alignment mark for an FeRAM cell in accordance with yet another aspect of the present invention.

Turning now to FIG. 11, alternative methods providing a pre-clean are illustrated regarding the formation of a barrier layer and a smoothing layer at 306, 310 and 316 of FIG. 7. Initially, at 400, a clean is provided of the wafer (a tungsten clean) prior to forming a barrier layer thereover. For example, an Ar plasma clean may be employed followed by isolating the cleaned tungsten from air exposure to avoid any contamination or oxidation thereof. The barrier layer is then formed at 402 which may act as a conductive diffusion barrier as well as an etch stop, depending upon subsequent processing. The diffusion barrier may be, for example, TiN deposited via CVD. A smoothing layer such as a conformal dielectric layer is then deposited at 404, such as $SiO_2$ formed via HDP CVD.

Subsequently, one option is to etch back the dielectric layer at 406 using the barrier layer at an etch stop, for example, using a fluorine containing dry etch chemistry with oxygen added to enhance the selectivity to the underlying TiN barrier layer. Alternatively, at 408 a top portion of the dielectric and barrier layer are removed via CMP. Since the barrier layer has been removed over the contact via 202, however, another barrier layer may subsequently be formed at 410, which allows the thickness thereof to be more tailored for its intended purpose in conjunction with overlying ferroelectric capacitors. One then returns to 320 of FIG. 7, as illustrated in FIG. 11.

Protecting Alignment Mark Using Dielectric Diffusion Barrier

In accordance with one exemplary aspect of the present invention, the tungsten sidewall surface within the alignment mark via may be protected (action 304) using an additional CVD dielectric layer that is not reactive to the ferroelectric. Subsequently, at 310 a lead and oxygen dielectric diffusion barrier layer 312 is formed over the barrier layer 308 in a generally conformal manner so as to cover the sidewall surface within the alignment mark via, as illustrated in FIG. 8. In one exemplary aspect of the present invention, the dielectric barrier layer 310, AlO or TaO may be employed which are good barriers to lead and oxygen diffusion to prevent oxidation of the tungsten layer 210. In some preferred embodiment, a conductive etch stop layer such as TiN (PVD or CVD) or even the bottom electrode diffusion barrier might be deposited prior to the dielectric barrier layer. The etch stop can be used since the dielectric barrier layer needs to be removed from the top layer using either dry etch or CMP.

W Removal Using Added Mask

Figure 12:
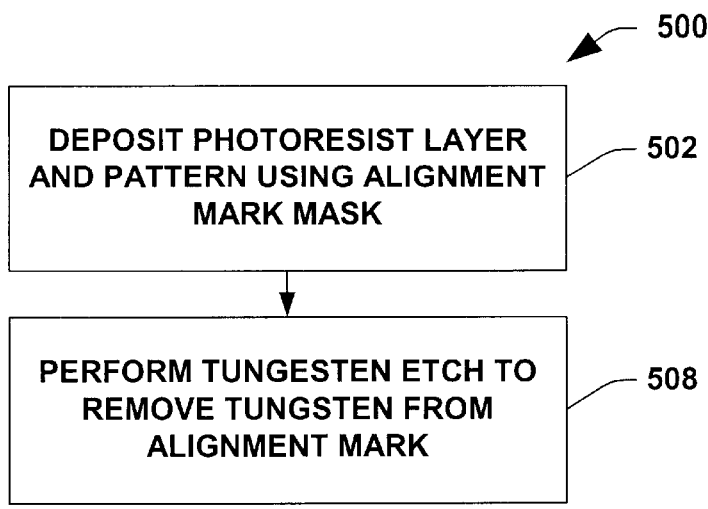
FIG. 12 is another flow chart diagram illustrating a method of forming an alignment mark for an FeRAM cell in accordance with still another aspect of the present invention.
Figure 13:
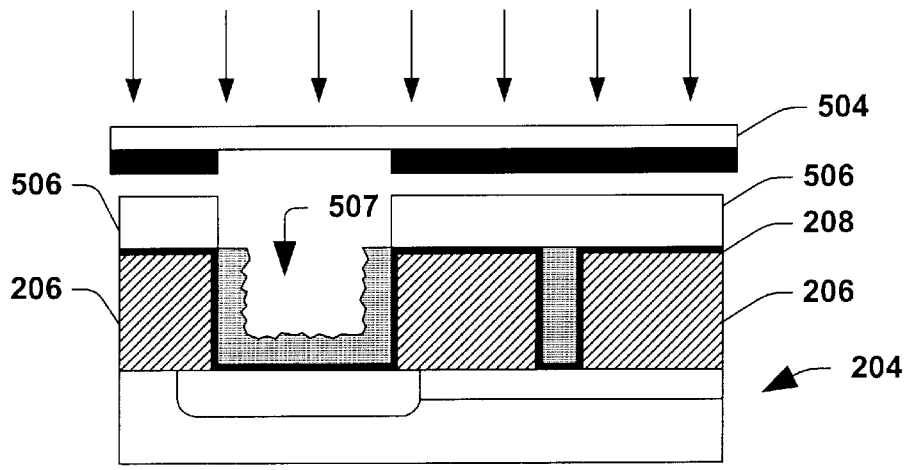
FIGS. 13 and 14 are fragmentary cross section diagrams illustrating a manner of forming an alignment mark by removing the tungsten layer within the alignment mark via in accordance with one aspect of the present invention.

According to another aspect of the present invention, another method of forming an alignment mark using an alignment mark via which overcomes the shortcomings associated with the prior art is illustrated in the flow chart of FIG. 12 and will be discussed in conjunction with FIGS. 13 and 14. The method, designated at reference numeral 500 comprises depositing a photoresist layer over the tungsten layer which has filled the contact vias and covered in a generally conformal manner the alignment mark via 202 at 502. Action 502 continues by patterning the photoresist using an alignment mark mask so as to expose the tungsten material residing within the alignment mark via. For example, as illustrated in FIG. 14, a photolithography mask 504 (which may be custom for the alignment mark via) exposes a photoresist layer 506, and upon development, the exposed photoresist within the alignment mark via 202 is removed to expose the tungsten therein, illustrated at reference numeral 507.

Figure 14:
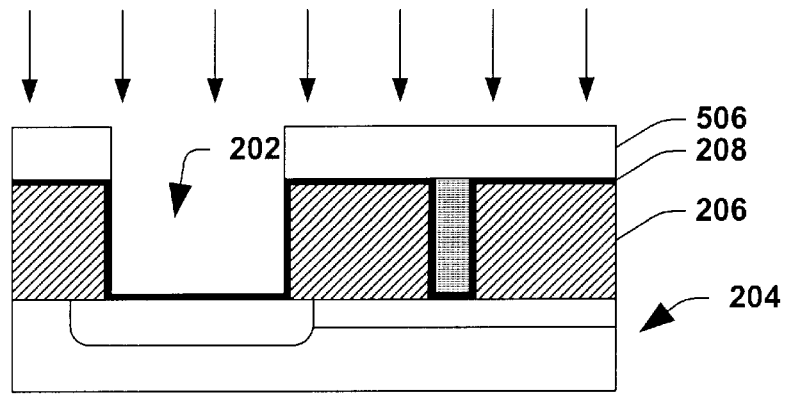

Returning again to FIG. 12, the method 500 continues at 508, wherein a tungsten etch is performed to remove the exposed tungsten 507 from the alignment mark via 202, as illustrated in FIG. 14. The tungsten within the alignment mark via 202 may be removed via wet etching or dry etching, as may be desired, wherein the etchant or etch chemistry is substantially selective with respect to the barrier layer or the surrounding dielectric material. The resulting alignment mark via 202 has a substantially smooth sidewall surface 510 so that subsequent capacitor stack materials will form therein in a substantially conformal manner as desired so that a topography variation in the subsequently formed hard mask layer will accurately reflect the location of the alignment mark via. In addition, even if a local failure occurs in the step coverage along the sidewall 510, such a failure is substantially less severe since such reaction will not be as aggressive as the oxidation of tungsten with its negative large volume expansion as in the prior art.

Figure 15:
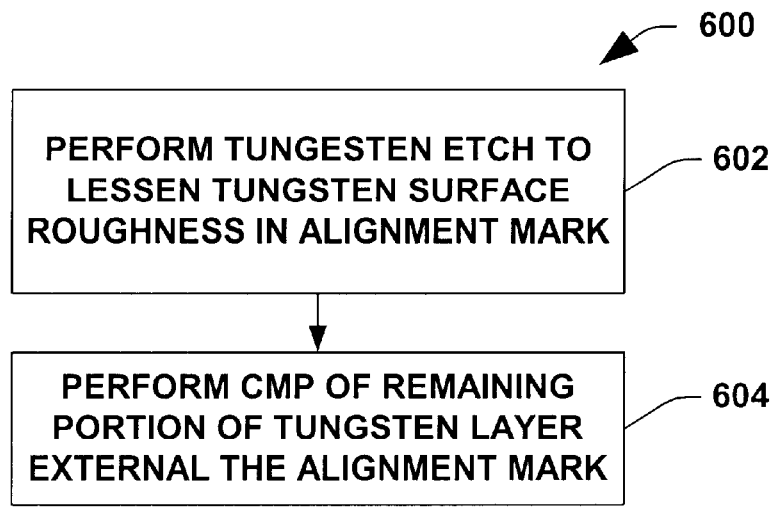
FIG. 15 is another flow chart diagram illustrating a method of forming an alignment mark for an FeRAM cell in accordance with yet another aspect of the present invention.

According to yet another aspect of the present invention, another method of overcoming the problems associated with forming alignment marks associated with FeRAM capacitors in the conventional manner is provided in the flow chart of FIG. 15, and is designated at reference numeral 600. The method 600 of FIG. 15 will be discussed in conjunction with FIGS. 16 and 17, respectively.

Figure 16:
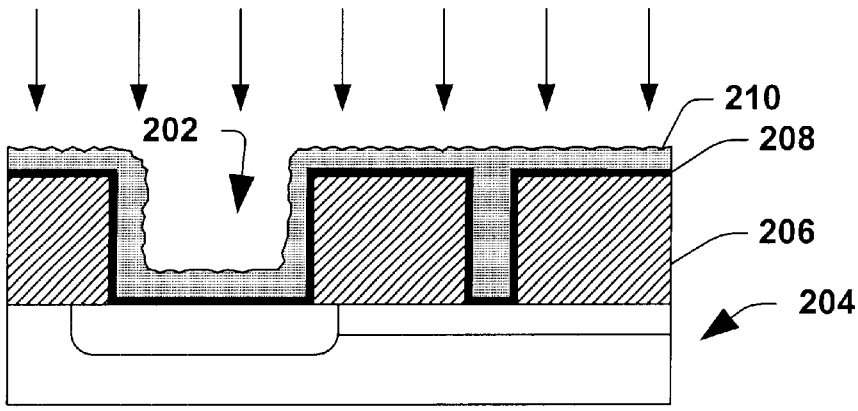
FIGS. 16 and 17 are fragmentary cross section diagrams illustrating a manner of reducing a surface roughness of a tungsten layer within the alignment mark via in accordance with another aspect of the present invention.

The method 600 begins at 602, wherein a tungsten etch is performed after the tungsten deposition which fills the contact holes and covers the alignment mark via in a generally conformal manner. The etch is illustrated in FIG. 16, wherein the tungsten layer 210 is etched with a dry plasma or reactive ion etch (RIE) for a short period of time so as not to completely remove the tungsten. Such a limited etch knocks off the corners of the rough tungsten surface, thereby reducing a roughness associated therewith. In addition, if the dry etch chemistry further includes Ar, the tungsten which is sputtered from the bottom portion of the alignment mark via 202 during the etch process will tend to redeposit on the alignment mark via sidewalls, thus further reducing the surface roughness associated therewith.

Figure 17:
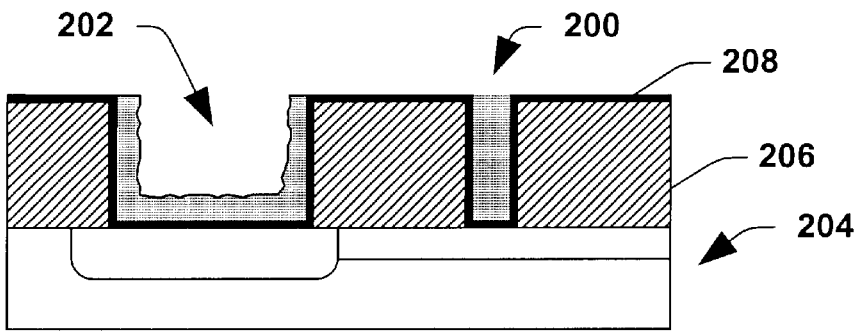

The method 600 continues at 604, wherein a remaining portion of the etched tungsten layer 210 overlying the dielectric layer 206 is removed with a planarization process such as CMP, as illustrated in FIG. 17. After the CMP process, the exposed tungsten 210 within the alignment mark via 202 is substantially less rough, thereby improving the step coverage of subsequent layers thereover, such as the barrier layer. As discussed above, the improved step coverage of the barrier layer (not shown in FIG. 17) prevents the underlying tungsten from oxidizing aggressively during subsequent oxygen rich processing steps.

Therefore the method 600 of FIG. 15 improves the accuracy of the alignment mark by implementing a two step tungsten removal process, wherein a first step of the process incorporates an etch to smooth the tungsten, followed by a CMP process to remove the tungsten over the dielectric layer 206. Since a smoother tungsten material in the alignment mark via 202 facilitates good step coverage of an overlying barrier layer, a topography variation accurately reflecting the alignment mark via position will be generated in overlying layers, thereby facilitating the alignment of the lithography mask associated with defining the hard mask.

Returning now to FIG. 6, an exemplary, more detailed description of the subsequent formation of an FeRAM capacitor using the smoothed sidewalls within the alignment mark via is provided below. If necessary an additional diffusion and/or oxidation barrier layer may be deposited prior to the formation of the bottom electrode layer, if desired. The conductive barrier layer comprises, for example, TiAlN or other possible barriers (some of which have a slow oxidation rate compared to TiN) which include: TaSiN, TiSiN, TiN, TaN, HfN, ZrN, HfAlN, CrN, TaAlN, CrAlN, or any other conductive material. A thickness of this layer is, preferably, on the order of 60 nm (for a 0.18 um via). In the future, scaling the via size will allow scaling of the barrier thickness as well. One exemplary deposition technique for the barrier layer is a reactive sputter deposition using $Ar+N_2$ or $Ar+NH_3$. It should be noted that Ar is a standard inert gas used for sputter deposition or physical etching based on cost and performance. It is possible to use other inert gases instead of Ar for these applications throughout the process described in this document. Other deposition techniques that might be used include, for example, chemical vapor deposition (CVD) or plasma enhanced CVD (PECVD).

CVD of nitrides actually results in carbo-oxy-nitrides especially when metalorganic precursors are used and this is also acceptable in many cases. For the preferred W contact it is preferred to deposit a bilayer diffusion barrier. First, a CVD TiN (for example, about 40 nm thick) is deposited followed by a PVD TiAlN layer (for example, about 30 nm thick). Even more preferred would be CVD or PECVD deposition of TiAlN (~60 nm thick). The preferred proportion of aluminum in TiAlN is around 30% or more and about 60% or less Al and about 40% or more and about 50% or less is more preferred in order to have improved oxidation resistance. A better diffusion barrier will, in general, allow the oxygen stable bottom electrode material (to be formed later) to be thinner or permit a higher process temperature to be used.

The bottom electrode 124 of the capacitor is formed at 306 of FIG. 6 either on the barrier layer or directly on the interlevel dielectric layer so as to make electrical connection with the underlying contact structure. Preferably, the bottom electrode 124 is around 25 nm thick or more and about 100 nm thick or less, is stable in oxygen, and is comprised of a noble metal or conductive oxide, for example, iridium, iridium oxide, Pt, Pd, PdOx, Au, Ru, $RuO_x$, Rh, $RhO_x$, $LaSrCoO_3$, $(Ba,Sr)RuO_3$, $LaNiO_3$ or any stack or combination thereof. For any electrode using noble metals, it is advantageous, from a cost and ease of integration standpoint, to use layers which are as thin as possible. A desirable bottom electrode for a PZT capacitor dielectric is either about a 50 nm thick Ir or a stack comprised of about 30 nm thick IrOx and about 20 nm thick Ir, which is formed, for example, by sputter deposition for Ir (Ar) and/or reactive sputter deposition ($Ar+O_2$) for IrOx. Lower ferroelectric deposition temperatures might allow even thinner electrodes, which may be desired. Another alternative deposition technique comprises chemical vapor deposition.

In order to control the stress of the bottom electrode, a post formation bottom electrode anneal may be performed for stress relaxation and/or to improve the microstructure/stability of the bottom electrode. Exemplary anneal conditions are about 400 C. or more and about 600 C. or less for about 2 min or more and about 10 min or less in an oxygen or an inert gas mixture. This anneal may be performed at any time after the formation of the bottom electrode, but preferably prior to the formation of the ILD 160.

The capacitor ferroelectric dielectric layer 126 is formed at 308 of FIG. 6 over the bottom electrode layer 124. Preferably, the ferroelectric dielectric 126 is less than about 150 nm thick (more preferably less than about 100 nm thick, and most preferably less than about 50 nm thick) and comprises of a ferro-electric material, such as $Pb(Zr,Ti)O_3$ (PZT—lead zirconate titanate); doped PZT with donors (Nb, La, Ta), acceptors (Mn, Co, Fe, Ni, Al), and/or both; PZT doped and alloyed with $SrTiO_3$, $BaTiO_3$ or $CaTiO_3$; strontium bismuth tantalate (SBT) and other layered perovskites such as strontium bismuth niobate tantalate (SBNT); or bismuth titanate; $BaTiO_3$; $PbTiO_3$; or $Bi2TiO_3$.

PZT is a desirable choice for the ferroelectric dielectric 126 because it has the highest polarization and the lowest processing temperature of the aforementioned materials. In addition, an exemplary Zr/Ti composition is around 20/80, respectively, in order to obtain good ferroelectric switching properties (for example, large switched polarization and relatively square-looking hysteresis loops). Alternatively, Zr/Ti compositions of approximately 65/35 may be employed to maximize uniformity in capacitor properties. Further, it is advantageous to have donor doped PZT with roughly about 0.05 to about 1% donor dopant because the donor dopant improves the reliability of the PZT by helping to control the point defect concentrations.

One exemplary and desirable deposition technique for these dielectrics is metal organic chemical vapor deposition (MOCVD). MOCVD is advantageous especially for thin films (for example, films less than about 100 nm thick). Thin PZT is extremely advantageous in making integration more simple (less material to etch), less expensive (less material to deposit and therefore less precursor) and allows lower voltage operation (lower coercive voltage for roughly the same coercive electric field). The capacitor dielectric 126 may be deposited in either a crystalline/poly-crystalline state or it can be deposited in an amorphous phase at low temperatures and then crystallized using a post-deposition anneal, which is commonly employed for Bi ferroelectric films. The post deposition crystallization anneal can be performed immediately after deposition or after later process steps such as electrode deposition or post capacitor etch anneal. The preferred MOCVD PZT approach results in a poly-crystalline film deposited at temperatures preferably between about 450 C. or more and about 600 C. or less (more preferred between about 500 and about 550 C.).

Alternatively, the dielectric layer 126 may be formed using a chemical solution deposition (for example, sol-gel or metal organic decomposition). In addition, one exemplary Zr/Ti composition is around 20/80 to obtain good ferroelectric switching properties (for example, large switched polarization and relatively square looking hysteresis loop). Alternatively, a Zr/Ti composition of around 65/35 may be employed in order to minimize switched polarization and uniformity in capacitor properties. Additionally, it may be desirable to have donor doped PZT with roughly 0.5 to 1% donor dopant. The donor dopant improves the reliability of the PZT by helping to control the point defect concentrations. The MOCVD process conditions, if employed, are desirably preformed at a temperature less than around 600 C. (even more preferred to be less than 550 C.). The deposition rate of the PZT is set to be between 100 and 200 nm/min. In order to have reproducible control of film composition, the MOCVD process may use two or even one cocktail of metalorganic precursors mixed together with a solvent to keep it a liquid. The MOCVD reactor is designed to vaporize the liquids with either one or two vaporizers and precisely control the reactor wall temperatures to prevent the precursors from either decomposing or condensing. An Ar or He carrier gas is, preferably, used to flow the precursors to the reactor chamber or showerhead where they are mixed with an oxidizer ($O_2$, $N_2O$, or $H_2O$, with $O_2$ preferred).

The top electrode layer(s) 128, 130 is formed at step 311 of FIG. 6 on the capacitor dielectric layer 126. In this exemplary aspect of the present invention, the top electrode is a multi-layer 128, 130; however, the top electrode can be implemented in just one layer. In one example, the first layer 128 comprises iridium oxide (for example, less than about 100 nm thick and more preferably less than about 50 nm thick), and the second layer 130 comprised iridium (for example, less than about 100 nm thick and more preferably less than about 50 nm thick). In particular, it is advantageous for Pb based ferroelectrics to have a conductive oxide top electrode such as $IrO_x$, $RuO_x$, $PdO_x$, $PtO_x$, $AgO_x$, $(Ba,Sr)RuO_3$, $LaSrCoO_3$, $LaNiO_3$, $YBa_2Cu_3O_{7-x}$ rather than a pure noble metal so as to minimize degradation due to many opposite state write/read operations (fatigue). Many of the Bi-containing ferroelectrics, such as SBT, can also use noble metal electrodes such as Pt, Pd, Au, Ag, Ir, Rh, and Ru and still retain good fatigue characteristics.

If the top electrode 128, 130 is an oxide, it is advantageous to have a noble metal layer above it in order to maintain low contact resistance between the top metal contact and oxide. For example, it is possible that a TiN layer in contact with IrOx might form $TiO_2$, which is thermally insulating, during subsequent thermal processes. For any electrode using a noble metal such as Pt, Ru, Pd, or Ir, it is advantageous, from a cost and integration standpoint, to use as thin a layer as possible. For PZT electrodes, the preferred top electrode stack 128, 130 is comprised of approximately 10 nm Ir deposited by PVD in Ar on approximately 20 nm IrOx deposited by reactive PVD in Ar+$O_2$ on top of the PZT capacitor dielectric. IrOx is preferred to be deposited below about 400 C. in gas mixtures of between about 50% and about 80% $O_2$ with the rest oxygen with a relatively low sputter power and hence a slow deposition rate (for example, less than about 20 nm/min).

It is possible to anneal the top electrode prior to deposition of a hard mask in order to control the stress in the top electrode 128, 130. For example, sputter deposited electrodes will typically be subject to compressive stress while, the stress in annealed electrode will be tensile.

A hard mask layer 132 is formed at 312 of FIG. 6 over the underlying capacitor stack layers. Preferably, the hard mask 132 is comprised of a material which is thick enough so as to retain its integrity during subsequent etch processing. The hard mask may be, for example, around 50 to 500 nm thick (more preferably around 100 to 300 nm thick—most preferably around 200 nm thick) and, for example, comprises TiAlN, TiN, Ti, $TiO_2$, Al, AlOx, AlN, TiAl, TiAlOx, Ta, TaOx, TaN, Cr, CrN, CrOx, Zr, ZrOx, ZrN, Hf, HfN, HfOx, silicon oxide, low-k dielectric, or any stack or combination thereof. An example of a hard mask stack is 300 nm of PECVD deposited $SiO_2$ on 50 nm of sputter deposited TiAlN or TiN.

The hard mask thickness is controlled by the subsequent etch processing and the relative etch rates of the various materials, the thicknesses of the etched layers, the amount of overetch required, and the desired remaining hard mask thickness after etching all of the layers. Thinner layers result in thinner hard masks. The hard mask may or may not be removed after the etching of the capacitor stack. If hard mask 132 is not removed, as illustrated in FIG. 3, then it is preferable to form the hard mask of a conductive material. However, a non-conductive or semiconductive material may be used, but the interconnection to the top electrode of the capacitor should preferably be formed through this hard mask (not shown) so as to make direct connection to the top electrode.

The deposition of the hard mask may be a single or multi-layer stack of different materials in order to better control the hard mask profile and remaining hard mask thickness. The preferred deposition process for metal nitride hard masks is sputter deposition using $Ar+N_2$ gas mixtures. One exemplary deposition process for silicon oxide containing hardmasks is TEOS PECVD.

In another example, a hard mask stack is 30 nm of TiAlN on 120 nm of TiAl, which is formed on 20 nm TiAlO which is formed on 50 nm of TiAlN. All of these layers are, for example, deposited by sputter deposition in the same chamber where the film composition is changed during the deposition by varying the gas composition ($Ar+N_2$ (50/50) for nitride, Ar for metal, and $Ar+O_2$ (90/10) or $Ar+N_2+O_2$ (85/10/5) for oxide). The TiAlN is, for example, deposited at around 400 C. with high power to achieve roughly 100 nm/min TiAlN deposition rate. The TiAlN can be replaced by TiN for all of these cases.

After the contact formation, several different deposition steps have been described. In particular, bottom diffusion barrier (step 304), bottom electrode (step 306), ferroelectric (step 308), top electrode (step 310) and hard mask (step 312). It is likely that all or nearly all of the pieces of equipment used in these process steps will be considered potentially contaminated by ferroelectric elements. Therefore these pieces of equipment generally will be dedicated. The wafers will most likely have a significant, if not a high, contamination level on the backside of the wafers. The next process step after hardmask deposition is typically lithography. It is likely that processing wafers with backside contamination through this tool will contaminate the tool and hence result in contamination of clean wafers processed through this tool with FeRAM contaminates on their backside. Therefore, it is preferred to clean the backsides of the FeRAM wafers so as to be able to share the lithography equipment and allow clean wafers to be processed through the lithography equipment without any FeRAM contamination.

If the hard mask 132 includes standard materials such as $SiO_2$ then the backside of the wafers might be cleaned prior to deposition of this later part of the hardmask. For example, if the hardmask is comprised of $SiO_2$ on TiAlN then it is preferred to clean the backside of the wafer after the TiAlN deposition process and before the $SiO_2$ deposition process. This will prevent the $SiO_2$ deposition tool from being contaminated, and, hence, allow it to be shared.

The cleaning process depends on the backside contamination elements and their contamination levels. Assuming the preferred approach (PVD barrier, hardmask, bottom electrode, top electrode and MOCVD PZT), there will be low levels of Ir on the backside, but continuous films thereof assuming the MOCVD process does not have edge exclusion. Therefore for this type of wafer contamination the preferred backside wafer clean process is a wet etch process that etches the back, edges and small region on the frontside of the wafer near the edge. The etch process is somewhat dependent on the materials present on the backside of the wafer (for example if it is Si, $SiO_2$ or $Si_3N_4$). Wet etching PZT preferably is accomplished using either a strong fluorine acid or an acid mixture with chlorine and fluorine etch chemistries, such as $H_2O+HF+HCl$ or $H_2O+NH_3F+HCl$.

Etching both layers with the same hard mask is not only cheaper but also allows the cell size to be smaller by eliminating misalignment tolerances which are necessary if more than one lithography step is used. As mentioned before, the preferred approach is to use the hard mask 132 with multiple etch processes. This etch process can be modified by using elevated temperatures in order to achieve even steeper sidewall slopes and, therefore, less critical dimension (CD) growth. In general, it is preferred to minimize CD growth and this can be achieved by having a steeper etch profile and/or by having thinner layers. The low temperature etch process of one embodiment of the instant invention which utilizes a hard mask achieves sidewall slopes of roughly 74 degrees for the PZT and Ir structures, while the TiAlN structure profile is steeper. The etch rate of Ir and PZT (slow etch rate materials) is roughly 100 nm/min.

For example, an etch process for the top electrode layer (and also the bottom electrode layer 124 which will follow after the formation of a protective sidewall) may be a $Cl_2+O_2$ or a $Cl_2+CO$ etch chemistry with either $N_2$ or Ar as potential additives. Preferably, $Cl_2+O_2$ is employed with $N_2$ added. For a Ti containing hard mask, the $O_2$ is preferably >5–10%. In addition, the etch may occur in a high density plasma (e.g., 1200 W) with an intermediate substrate bias (e.g., 300 W on chuck), at an intermediate pressure (e.g., 10 mTorr), and at a relatively high temperature (e.g., 350–400 C.).

In accordance with another example, the hard mask and top electrode are etched as follows. The etch approach uses one high-density plasma etch chamber to etch all the hard mask, top electrode layer, and dielectric layer using a process sequence in the same chamber. In each case the remote plasma density is set to near maximum power. The hard mask is first etched using chlorine chemistries (unless a $SiO_2$ hard mask is used, in which case a fluorine and chlorine chemistries are used). An exemplary TiAlN etch recipe comprises a $Cl_2$ and $N_2$ (80/20) etchant with a pressure around 10 mTorr and medium substrate bias. If TiAlOx is part of the hard mask then a short high power step may be added so as to break through this layer. After etching the hard mask, the resist is removed using $O_2$ and $N_2$ (85/15) at a pressure around 40 mTorr and a small substrate bias. The Ir/IrOx top electrode is, for example, etched using a $Cl_2+N_2+O_2$ chemistry (60/20/20) at high bias (around 100 nm/min etch rate) at lower pressures (around 3 mTorr). The oxygen is added to insure a high selectivity between the Ir etch and the TiAlN hard mask etch.

Yet another exemplary patterning approach uses a high temperature etch process to etch low volatility species near room temperature such as Ir, IrOx and PZT. The process sequence is therefore listed below. For an $SiO_2$ hard mask, the $SiO_2$ is first etched in a dedicated $SiO_2$ etch chamber (fluorine chemistries only) using standard $SiO_2$ etch chemistry. The resist is then removed using standard ash process (such as $O_2+N_2+H_2O+$optional $CF_4$). The TiAlN (underneath the $SiO_2$) will be etched in the high temperature etch chamber prior to the Ir preferably using similar chemistries and powers as discussed before but with a higher pressure (15–20 mTorr). For a TiAlN hard mask, a near room temperature etch chamber is used with process conditions similar to those discussed above. The resist can be removed in that chamber or in a dedicated chamber as well. The Ir/IrOx top electrode, PZT, IrOx/Ir bottom electrode and TiAlN bottom electrode diffusion barriers will be etched at high temperature using etch recipes similar to that discussed at room temperatures except the chamber pressure will be between 10–20 mTorr.

In addition, an exemplary etch process for the ferroelectric dielectric layer 126 will depend upon the type of ferroelectric material employed. For example, for a PZT material, an etch chemistry may include $Cl_2$ plus fluorine gas plus an oxidizer (e.g., $O_2$ or CO). For example, $Cl_2+O_2+CH_2F_2$ may be employed in a high density plasma (e.g., 1200 W) at an intermediate pressure (e.g., 10 mTorr), at a substrate bias of about 450 W RF on chuck, at a temperature of about 350–400 C. Alternatively, a $BCl_3$ chemistry with Ar may be implemented. Note that in FIGS. 5g–5j, the capacitor stack etch is illustrated as purely anisotropic for simplicity. However, the actual etch will not have vertical sidewalls, but rather will exhibit sloped sidewalls, as illustrated in FIG. 5k.

Alternatively, if PZT is the dielectric employed, the PZT may be etched in a reactive chemistry containing chlorine and fluorine (for example $Cl_2+CF_2+N_2+O_2$ (45/15/20/20)) at intermediate pressures (around 10 mTorr) and a high substrate bias (around 100 nm/min etch rate). Again, the oxygen is added to insure good selectivity between PZT etch rate and hard mask etch rate and also to minimize oxygen loss from the PZT.

The etch process is a relatively dirty process and hence it is likely that the etch tool and the frontside, edge and backside of the wafers will have FeRAM contamination or have etch residues with FeRAM contamination. It is, therefore, necessary to clean the frontside of the wafer and chemically remove etch residues and possibly remove a thin layer of damaged PZT. This post-capacitor-etch wet-clean may, with some etch conditions and chemistries, be as simple as a deionized water (DI water or DIW) clean (tank soak with or without megasonic followed by a spin rinse dry) or the tank etch might be acid-based in order to improve the clean or remove more damage. The etch process can also result in redeposition of conductive material such as noble metals on the sidewall. For example, with Ir bottom electrodes it is possible to redeposit Ir on the sidewalls of the PZT which would result in unacceptably high leakage current for the capacitor. The wet clean (step 350 of FIG. 6) can be used to also remove this unwanted material using chemistries that etch a little of the ferroelectric material and also will keep the unwanted material in solution. The backside and edges of the wafer are likely to be significantly contaminated by redeposition of FeRAM elements. They should be removed prior to processing in a shared tool.

The capacitor etch of step 314 of FIG. 6 results in damage or degradation of the ferroelectric which needs to be recovered. One method to recover this damage is by $O_2$ plasma exposure (to recover any oxygen loss that might have occurred) and/or a RTA or furnace anneal in an inert or oxidizing atmosphere (to add oxygen and to improve the crystallinity of the damaged surfaces created by the etch process. For PZT this anneal is preferably performed around 500–650 C. (for a furnace anneal the duration is preferably around 15 min to 2 hr) or 550–700 C. (for a RTA the duration is preferably around 10 sec to 60 sec).

The sidewalls of the resulting capacitor typically will be fairly steep. A sidewall diffusion barrier 118, 120 is, preferably, formed at step 360 of FIG. 6 on the capacitor stack prior to the formation of layer 134 and the etching of the interconnection holes. The sidewall diffusion barrier 118, 120 is advantageous because it allows for the misalignment of the interconnect without shorting out the capacitor, it protects the capacitor from the diffusion of most substances into the capacitor, and it protects the rest of the structures from the out-diffusion of substances from the capacitor.

In one exemplary aspect of the present invention, the sidewall diffusion barrier is illustrated as two layers (layers 118 and 120), but the sidewall diffusion barrier may be comprised of more or fewer layers. In one example, the layer 118 is around 30 nm thick and comprises $AlO_x$, $Ta_2O_5$, AlN, $TiO_2$, $ZrO_2$, $HfO_2$, or any stack or combination thereof; and layer 120 is around 30 nm thick and comprises silicon nitride, AlN, or any stack or combination thereof. One exemplary process for depositing the metal oxides or nitrides (which can also be carbo-oxy-nitrides especially when metalorganic precursors are used) is MOCVD under conditions with minimal free hydrogen (i.e., enough oxygen such that $H_2O$ is formed rather than $H_2$). It is also possible to use plasma enhanced CVD or MOCVD process.

Alternatively, reactive sputter deposition can be used with either $Ar+O_2$ (for oxides), $Ar+N_2$ (for nitrides) or $Ar+O_2+N_2$ (for oxy-nitrides). One exemplary process for silicon nitride is CVD or PECVD. For a low hydrogen process, the process gases should be $SiH_4$ and $N_2$, where the flow rate of $N_2$ is much greater than that of $SiH_4$. For a hydrogen free PECVD $Si_3N_4$ deposition process, then $SiCl_4+N_2$ should be used and, again, it is beneficial to have a flow rate of $N_2$ which is much greater than that of $SiCl_4$. For the example listed here, the AlOx layer is used as a Pb and H diffusion barrier while the $Si_3N_4$ layer is used as a contact etch stop.

If a subsequent via etch can be modified so that it stops on the sidewall layer (AlOx, for example) then the one layer performs as an etch stop and an additional layer (i.e. Si3N4) is not necessary. In this case, the thickness of the sidewall might need to be increased.

An alternative approach is to etch back the sidewall material after deposition. This etchback can be done after deposition of the diffusion barrier layer(s). In one preferred embodiment AlOx (approximately 40 nm is preferred) is deposited followed by an etchback using chlorine containing etch gas ($BCl_3$ or $Cl_2$ for example) followed by PECVD deposition of $Si_3N_4$ (approximately 30 nm is preferred).

If the etch damage has not yet been healed by an anneal, then the anneal can be performed after the sidewall diffusion barrier deposition. For PZT this anneal is, preferably, performed around 500–650 C. (for a furnace anneal for around 15 min to 2 hr) or 550–700 C. (for a RTA for around 10 sec to 60 sec). Even more preferred is a RTA at 650 C. for 1 min. This option is desirable if the choice of interlayer dielectric layer that is formed directly above the ferroelectric capacitor is a low-K material with a maximum thermal budget of less than around 500 C. This anneal can be performed in an oxidizing or inert atmosphere conditions.

At the beginning of the AlOx deposition process, the front side of the wafer has exposed FeRAM elements. The AlOx deposition process may or may not result in contamination of the tool (defined to be additional FeRAM contaminants on subsequent wafers at levels above care-about-level, which is around $10^{10}$ atoms/cm$^2$). If the AlOx deposition process on FeRAM wafers does not result in contamination then it is preferred to wet clean the backside of the wafer prior to depositing this sidewall diffusion barrier. If the AlOx deposition process on FeRAM wafers does result in tool contamination then the preferred backside clean can be done after this step. The wet chemistry used to clean the backside of the wafer might be different from that used the first time since the contamination of the backside is expected to have different elemental concentration levels.

Above the sidewall diffusion barrier an interlayer dielectric(s) are deposited (at step 370 of FIG. 6). A thin dielectric layer (not shown) may be formed between each of the interlevel dielectric layers (layers 112, 134 and 160). If formed, this thin layer is, for example, a silicon nitride, silicon carbide, (SiCNO) or an siliconoxide (preferably a high-density plasma oxide). In addition, interlevel dielectric layers 112, 134, and 160 comprise, for example, an oxide, FSG, PSG, BPSG, PETEOS, HDP oxide, a silicon nitride, silicon oxynitride, silicon carbide, silicon carbo-oxy-nitride, a low dielectric constant material (preferably SiLK, porous SiLK, teflon, low-K polymer (possibly porous), aerogel, xerogel, BLACK DIAMOND, HSQ, or any other porous glass material), or a combination or stack thereof. The thermal budget of the first and second ILDs (112/134) will impact FeRAM module process details. After the deposition of the second interlayer dielectric (134) the preferred process is to planarize the dielectric preferably using CMP in order to make the surface flat for subsequent lithography process. Depending on the choice of back-end metallization there are multiple processing options. For etched Al metallization, the primary option is for Al or W vias. For damascene metallization (Al or Cu is preferable) there is the choice of dual damascene (via and metal filled at same time) or separate metal vias (Al, Cu or W) filled prior to single damascene metal. All of the process routes using vias and etched metal or single damascene metal (referred to as via first) are more similar with regards to FeRAM process details compared to dual damascene approach.

An exemplary process flow for via first is as follows. Depending on the metallization scheme such as Cu, a diffusion barrier/etch stop (typically silicon carbide, silicon nitride, silicon oxygen nitride, silicon carbo-oxy-nitride) will be deposited on the ILD. Lithography will then be used to form a patterned resist. The contact etch process will then etch through following stack: antireflection coating (if present), etch stop (if present), ILD, then sidewall diffusion barrier(s) which overlie the capacitor. It is likely that a different etch process (chemistry and plasma condition) will be used for each different material (not because the via depth is less above the contacts compared to in the periphery). In the preferred embodiment where the sidewall diffusion barrier is comprised of $Si_3N_4$ on AlOx, the $Si_3N_4$ can act as an etch stop for the ILD etch. This is a standard etch for applications like gate etch where there is a height difference in the ILD thickness between various etched regions. After the ILD etch, the $Si_3N_4$ and AlOx (which is exposed by the via hole) is subsequently etched either using the same or different chemistries, for example a $BCl_3$+Ar etch chemistry. In general, all of the etch steps will be timed because of the small via area. However, endpointing through some realtime measurement (optical emission or gas phase RGA) is preferred. For FeRAM damage control it is especially important to control the bottom layer sidewall barrier etch process. It is preferred to use plasma conditions with smaller plasma damage and uniform etch rates with less overetch. After the via etch process, the resist is typically removed by an ash process followed by wet clean and dry.

In one example, an anneal process step is performed at step 380 of FIG. 6 after the via etch step to remove etch damage. For a PZT capacitor dielectric, this anneal may be performed at around 500–650 C. (furnace anneal is desirably around 15 min to 2 hr) or 550–700 C. (RTA is desirable for about 10 sec to about 60 sec). Even more preferred is an RTA process at around 650 C. for around 1 min. It is also preferred that the anneal be performed in an inert atmosphere ($N_2$ or Ar) so as not to oxidize the top electrode diffusion barrier. This option is preferred if the choice of interlayer dielectric is a low-K material with a maximum thermal budget of less than 500 C. If the maximum thermal budget of the first or second ILDs (112/134) makes this impossible then it is preferred to use the maximum thermal budget possible for that ILD, using an RTA process.

Once the via has been formed, the via can be filled using a standard metallization. Typical metallizations and diffusion barriers have already been described, but include metals of Cu, W, doped Al with barriers of Ta nitride or Ti/TiN. It is preferred to use a short plasma clean (Ar, Ar+$N_2$ for example) to clean the bottom of the via prior to deposition of the barrier and metal layers in a tool without any vacuum breaks between clean and deposition. For Cu, it is preferable to use Ta, TaNx or TiN barrier followed by Cu seed layer deposition. This is, preferably, followed by electroplated or deposited copper. The Cu and barrier above the interlevel dielectric is, preferably, removed by CMP. For W vias, it is preferable to use Ti/TiN barrier followed by CVD W and the excess tungsten is removed by etchback or CMP. For Al vias, a Ti/TiN barrier is followed by Al deposition (CVD, PVD with reflow, or hot PVD). The Al on top of the ILD is either removed or patterned and etched to form metal lines.

The via etch tool, post via clean, anneal tool, metal plasma clean and even barrier deposition tool can potentially become contaminated with FeRAM elements if the top electrode and PZT are not protected by a conducting hard mask and/or a diffusion barrier or sidewall diffusion barrier. Even with this protection, etch tool contamination might occur by process mistake, such as large over-etch. Therefore depending on the process control and significant monitoring, these tools can be shared instead of being dedicated. If the decision is that these tools need to be dedicated, then it might also be decided to use a backside wet clean process after the wafer leaves the last dedicated tool in order to eliminate any chance that FeRAM contamination might spread to other non-contaminated tools.

An exemplary process flow for a dual damascene process is now described. The flow described here is the via first flow, but many of the ferroelectric-specific aspects will also apply to the other process flow routes. Depending on the metallization scheme, such as Cu, a diffusion barrier/etch stop (preferably comprised of silicon carbide, silicon nitride, silicon oxygen nitride, silicon carbo-oxy-nitride) will be deposited on the ILD. Afterwards a second intermetal layer dielectric (IMD or ILD) is deposited using one of the choices described above (which is, sometimes, followed by another diffusion barrier/etch stop). Lithography is then used to pattern the vias. The vias are then etched using the same procedure as described above, but this time there are potentially multiple layers of dielectrics prior to reaching the sidewall diffusion barrier. In addition, the aspect ratio of the first (deep) via for the dual-damascene approach is larger than with just a via. After the resist ash, via etch and clean, the first vias are filled with resist and lithography for the metal pattern is performed. The metal pattern is etched into the top dielectric and the depth is either controlled during the etch process or by an etch stop. The resist is then removed and etch debris removed by wet clean.

The next exemplary step is to perform a post etch recovery anneal and now the thermal budget is limited by more dielectric layers. For a capacitor dielectric comprised of PZT, this anneal is preferably around 500–650 C. (for a furnace anneal of around 15 min to 2 hr) or 550–700 C. (for RTA process of around 10 sec to 60 sec). Even more preferred is an RTA process at around 650 C. for around 1 min. It is also preferred that the anneal be performed in an inert atmosphere (N$_2$ or Ar) so as not to oxidize the top electrode diffusion barrier. This option is preferred if the choice of interlayer dielectric is a low K material with a maximum thermal budget of less than 500 C. If the maximum thermal budget of the ILD makes this impossible then it is preferred to use the maximum thermal budget possible for that ILD using RTA process.

The next exemplary step is to deposit the barrier and metal to simultaneously fill depressions for vias and for metal lines. Typical metallizations and diffusion barrier have already been described but for a damascene process these include Cu, W and doped Al with barriers of Ta, TaNx, or Ti/TiN. It is preferred to use a short plasma clean (Ar, Ar+N$_2$ for example) to clean the bottom of the via prior to deposition of the barrier and metal films in a tool without any vacuum breaks between clean and deposition.

The contamination issues with a dual damascene approach are similar to that of via first approach.

Interconnect 136 is formed so as to provide the electrical connection to the top electrode. The interconnect is connected to conductor 144 which is, preferably, connected to a drive line. The drive line is preferably brought to a potential around 1.2 volts during the operation of the device and this voltage will be scaled with the logic technology generation used.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of forming an FeRAM capacitor over one or more transistors associated with a semiconductor substrate, comprising:

forming a dielectric layer over the one or more transistors;

forming a contact via and an alignment mark via in the dielectric layer, wherein the contact via extends down to a portion of one of the one or more transistors;

forming a tungsten layer over the dielectric layer, wherein the tungsten layer fills the contact via and is substantially conformal with respect to the alignment mark via, wherein a sidewall surface of a portion of the tungsten layer within the alignment mark via has a roughness associated therewith;

reducing the sidewall surface roughness of the tungsten layer within the alignment mark via;

patterning the tungsten layer, thereby electrically isolating the contact via and the alignment mark via, respectively;

forming capacitor stack layers over the dielectric layer, the contact via and the alignment mark via, respectively, wherein the capacitor stack layers are substantially conformal with respect to the alignment mark via thereunder, thereby resulting in a topology variation in a top portion of the capacitor stack layers associated with the alignment mark via;

using the topology difference in the capacitor stack layers as an alignment mark to position a patterned hard mask over the capacitor stack layers; and patterning the capacitor stack layers using the patterned hard mask, thereby defining a capacitor stack structure.

2. The method of claim 1, wherein forming the capacitor stack layers further comprises:

forming a barrier layer over the dielectric layer, wherein the barrier layer covers both the dielectric layer and the patterned tungsten layer in the contact via and the alignment mark via, respectively;

forming a bottom electrode layer over the barrier layer;

forming a ferroelectric dielectric layer over the bottom electrode layer; and forming a top electrode layer over the ferroelectric dielectric layer.

3. A method of forming an FeRAM capacitor over one or more transistors associated with a semiconductor substrate, comprising:

forming a dielectric layer over the one or more transistors;

forming a contact via and an alignment mark via in the dielectric layer, wherein the contact via extends down to a portion of one of the one or more transistors;

forming a tungsten layer over the dielectric layer, wherein the tungsten layer fills the contact via and is substantially conformal with respect to the alignment mark via, wherein a sidewall surface of a portion of the tungsten layer within the alignment mark via has a roughness associated therewith;

reducing the sidewall surface roughness of the tungsten layer within the alignment mark via, wherein reducing the sidewall surface roughness of the tungsten layer within the alignment mark via comprises:

forming a smoothing layer over the tungsten layer; and patterning the smoothing layer, wherein the patterning removes the smoothing layer on a portion of the tungsten layer which overlies the dielectric layer and the contact via, and leaves another portion of the smoothing layer on the sidewall surface of the tungsten layer within the alignment mark via;

patterning the tungsten layer, thereby electrically isolating the contact via and the alignment mark via, respectively;

forming capacitor stack layers over the dielectric layer, the contact via and the alignment mark via, respectively, wherein the capacitor stack layers are substantially conformal with respect to the alignment mark via thereunder, thereby resulting in a topology variation in a top portion of the capacitor stack layers associated with the alignment mark via;

using the topology difference in the capacitor stack layers as an alignment mark to position a patterned hard mask over the capacitor stack layers; and patterning the capacitor stack layers using the patterned hard mask, thereby defining a capacitor stack structure.

4. The method of claim 3, wherein patterning the smoothing layer comprises performing a chemical mechanical polish, thereby removing the smoothing layer and the tungsten layer at a region overlying the dielectric layer and the contact via.

5. The method of claim 3, wherein patterning the smoothing layer comprises performing a chemical etch thereof.

6. The method of claim 5, further comprising forming a barrier layer over the tungsten layer before forming the smoothing layer, wherein the barrier layer serves as an etch stop during the chemical etch of the smoothing layer.

7. The method of claim 6, wherein the barrier layer comprises TiN, TiAlN, TaSiN, ZrN or HfN.

8. The method of claim 6, further comprising cleaning the tungsten layer prior to forming the barrier layer.

9. The method of claim 8, wherein cleaning the tungsten layer comprises:
  performing an Ar plasma clean; and
  preventing an exposure of the cleaned tungsten layer to air between the cleaning and the formation of the barrier layer.

10. The method of claim 3, wherein the smoothing layer comprises SiO2, and wherein patterning the $SiO_2$ smoothing layer comprises performing a chemical etch with a fluorine containing etch chemistry.

11. The method of claim 10, further comprising adding oxygen to the fluorine containing etch chemistry.

12. The method of claim 6, further comprising etching the barrier layer after an etching of the smoothing layer, thereby removing a portion of the barrier layer over the dielectric layer and the contact via, and leaving another portion of the sidewall surface of the alignment mark via.

13. The method of claim 3, wherein the smoothing layer comprises $SiO_2$, $Si_3N_4$, SiN, AlOx, TaOx, or $TiO_2$.

14. The method of claim 3, wherein forming the smoothing layer comprises depositing a $SiO_2$ layer using chemical vapor deposition.

15. The method of claim 3, further comprising forming a barrier layer over the smoothing layer.

16. The method of claim 3, wherein forming the smoothing layer comprises:
  forming a TiN, TiAlN, TaSiN, ZrN or HfN barrier layer over the tungsten layer in a substantially conformal manner using chemical vapor deposition;
  forming an $SiO_2$, $Si_3N_4$ or SiN layer over the barrier layer in a substantially conformal manner using chemical vapor deposition; and
  etching the smoothing layer with a fluorine containing etch chemistry, wherein the barrier layer serves as an etch stop, and wherein the etching removes the $SiO_2$, $Si_3N_4$ or SiN smoothing layer in regions overlying the dielectric layer and the contact via, and leaves a portion of the smoothing layer on the sidewall surface of the alignment mark via.

17. A method of forming an FeRAM capacitor over one or more transistors associated with a semiconductor substrate, comprising:
  forming a dielectric layer over the one or more transistors;
  forming a contact via and an alignment mark via in the dielectric layer, wherein the contact via extends down to a portion of one of the one or more transistors;
  forming a tungsten layer over the dielectric layer, wherein the tungsten layer fills the contact via and is substantially conformal with respect to the alignment mark via, wherein a sidewall surface of a portion of the tungsten layer within the alignment mark via has a roughness associated therewith;
  reducing the sidewall surface roughness of the tungsten layer within the alignment mark via, wherein reducing the sidewall surface roughness of the tungsten layer within the alignment mark via comprises removing a portion of the tungsten layer within the alignment mark via;
  patterning the tungsten layer, thereby electrically isolating the contact via and the alignment mark via, respectively;
  forming capacitor stack layers over the dielectric layer, the contact via and the alignment mark via, respectively, wherein the capacitor stack layers are substantially conformal with respect to the alignment mark via thereunder, thereby resulting in a topology variation in a top portion of the capacitor stack layers associated with the alignment mark via;
  using the topology difference in the capacitor stack layers as an alignment mark to position a patterned hard mask over the capacitor stack layers; and
  patterning the capacitor stack layers using the patterned hard mask, thereby defining a capacitor stack structure.

18. The method of claim 17, wherein the portion of the tungsten layer removed within the alignment mark via comprises substantially all of the tungsten layer within the alignment mark via.

19. The method of claim 18, wherein removing substantially all of the tungsten layer within the alignment mark via comprises:
  forming a photoresist layer over the tungsten layer;
  patterning the photoresist layer, thereby defining an opening over a portion of the tungsten layer within the alignment mark via; and
  etching the tungsten layer through the opening.

20. The method of claim 17, wherein removing the portion of the tungsten layer comprises:
  etching the tungsten film, wherein the etching reduces a surface roughness of the tungsten film including the sidewall surface roughness within the alignment mark via; and
  performing a chemical mechanical polish of a remaining portion of the tungsten layer overlying the dielectric layer and the contact via.

21. The method of claim 20, further comprising etching with an Ar additive, wherein the Ar additive facilitates portions or removed tungsten to redeposit on the sidewall surface of the tungsten layer within the alignment mark via, thereby reducing the sidewall surface roughness associated therewith.

22. A method of forming an FeRAM capacitor over one or more transistors associated with a semiconductor substrate, comprising:
  forming a dielectric layer over the one or more transistors;
  forming a contact via and an alignment mark via in the dielectric layer, wherein the contact via extends down to a portion of one of the one or more transistors;
  forming a tungsten layer over the dielectric layer, wherein the tungsten layer fills the contact via and is substantially conformal with respect to the alignment mark via, wherein a sidewall surface of a portion of the tungsten layer within the alignment mark via has a roughness associated therewith;
  removing substantially all of the tungsten within the alignment mark via;
  planarizing a portion of the tungsten layer overlying the dielectric layer, thereby electrically isolating the contact via and the alignment mark via, respectively;
  forming capacitor stack layers over the dielectric layer, the contact via and the alignment mark via, respectively, wherein the capacitor stack layers are substantially conformal with respect to the alignment mark via thereunder, thereby resulting in a topology variation in a top portion of the capacitor stack layers associated with the alignment mark via;

using the topology difference in the capacitor stack layers as an alignment mark to position a patterned hard mask over the capacitor stack layers; and patterning the capacitor stack layers using the patterned hard mask, thereby defining a capacitor stack structure.

23. A method of forming an FeRAM capacitor over one or more transistors associated with a semiconductor substrate, comprising:

forming a dielectric layer over the one or more transistors;

forming a contact via and an alignment mark via in the dielectric layer, wherein the contact via extends down to a portion of one of the one or more transistors;

forming a tungsten layer over the dielectric layer, wherein the tungsten layer fills the contact via and is substantially conformal with respect to the alignment mark via, wherein a sidewall surface of a portion of the tungsten layer within the alignment mark via has a roughness associated therewith;

removing substantially all of the tungsten within the alignment mark via, wherein removing substantially all of the tungsten layer within the alignment mark via comprises:

forming a photoresist layer over the tungsten layer;

patterning the photoresist layer, thereby defining an opening over a portion of the tungsten layer corresponding to the alignment mark via; and etching the tungsten layer through the opening;

planarizing a portion of the tungsten layer overlying the dielectric layer, thereby electrically isolating the contact via and the alignment mark via, respectively;

forming capacitor stack layers over the dielectric layer, the contact via and the alignment mark via, respectively, wherein the capacitor stack layers are substantially conformal with respect to the alignment mark via thereunder, thereby resulting in a topology variation in a top portion of the capacitor stack layers associated with the alignment mark via;

using the topology difference in the capacitor stack layers as an alignment mark to position a patterned hard mask over the capacitor stack layers; and patterning the capacitor stack layers using the patterned hard mask, thereby defining a capacitor stack structure.

* * * * *